(12) United States Patent
Tang et al.

(10) Patent No.: US 6,245,607 B1
(45) Date of Patent: Jun. 12, 2001

(54) BURIED CHANNEL QUASI-UNIPOLAR TRANSISTOR

(75) Inventors: Denny Duan-Lee Tang, Saratoga, CA (US); Hu Herbert Chao, Taipei (TW)

(73) Assignee: Industrial Technology Research Institute, Hsin-chu (TW)

( * ) Notice: Subject to any disclaimer, the term of this patent is extended or adjusted under 35 U.S.C. 154(b) by 0 days.

(21) Appl. No.: 09/222,270

(22) Filed: Dec. 28, 1998

(51) Int. Cl.[7] .......................... H01L 29/76; H01L 29/94; H01L 31/062; H01L 31/113
(52) U.S. Cl. ............................. 438/217; 438/229
(58) Field of Search .................... 438/217, 229; 257/401, 402

(56) References Cited

U.S. PATENT DOCUMENTS

| | | | |
|---|---|---|---|
| 4,089,022 | 5/1978 | Asai et al. | 357/23 |
| 4,999,518 | 3/1991 | Dhong et al. | 307/446 |
| 5,006,730 | 4/1991 | Davis | 307/446 |
| 5,012,318 | 4/1991 | Honjo | 357/43 |
| 5,132,234 | 7/1992 | Kim et al. | 437/31 |
| 5,407,841 | 4/1995 | Liao et al. | 437/31 |
| 6,051,482 | * 4/2000 | Yang . | |

OTHER PUBLICATIONS

Muller et al, Device Electronics for Integrated Circuits, pp 505–508, 1986.*

* cited by examiner

Primary Examiner—Stephen D. Meier
(74) Attorney, Agent, or Firm—George O. Saile; Stephens B. Ackerman; Billy Knowles

(57) ABSTRACT

A buried channel lateral quasi-unipolar transistor having low flicker or 1/f noise has a bulk region that forms the base of the buried quasi-unipolar transistor. A drain region is implanted into the bulk region to form a drain/collector. A source region is placed at a distance from the drain region and is implanted in the bulk region to form a source/emitter. A channel layer is implanted in the bulk region between the source region and the drain region to provide a low resistivity conduction channel between the drain/collector and the source/emitter. A gate oxide is placed on the surface of the semiconductor substrate immediately above the channel layer. Then a gate electrode of a conductive material such as polycrystalline silicon doped to with a material having a conductivity opposite that of the source/drain deposited on the gate oxide above the channel region. A biasing voltage source connected between the gate electrode and the bulk region to lower a built-in voltage of the quasi-unipolar transistor. The buried channel lateral quasi-unipolar transistor further may have an overlayer implanted between the channel layer and the surface of the semiconductor substrate to form the buried channel layer rather than at the surface of the semiconductor substrate. The buried channel lateral quasi-unipolar transistor may be placed in a diffusion well into which a bulk region is implanted.

14 Claims, 20 Drawing Sheets

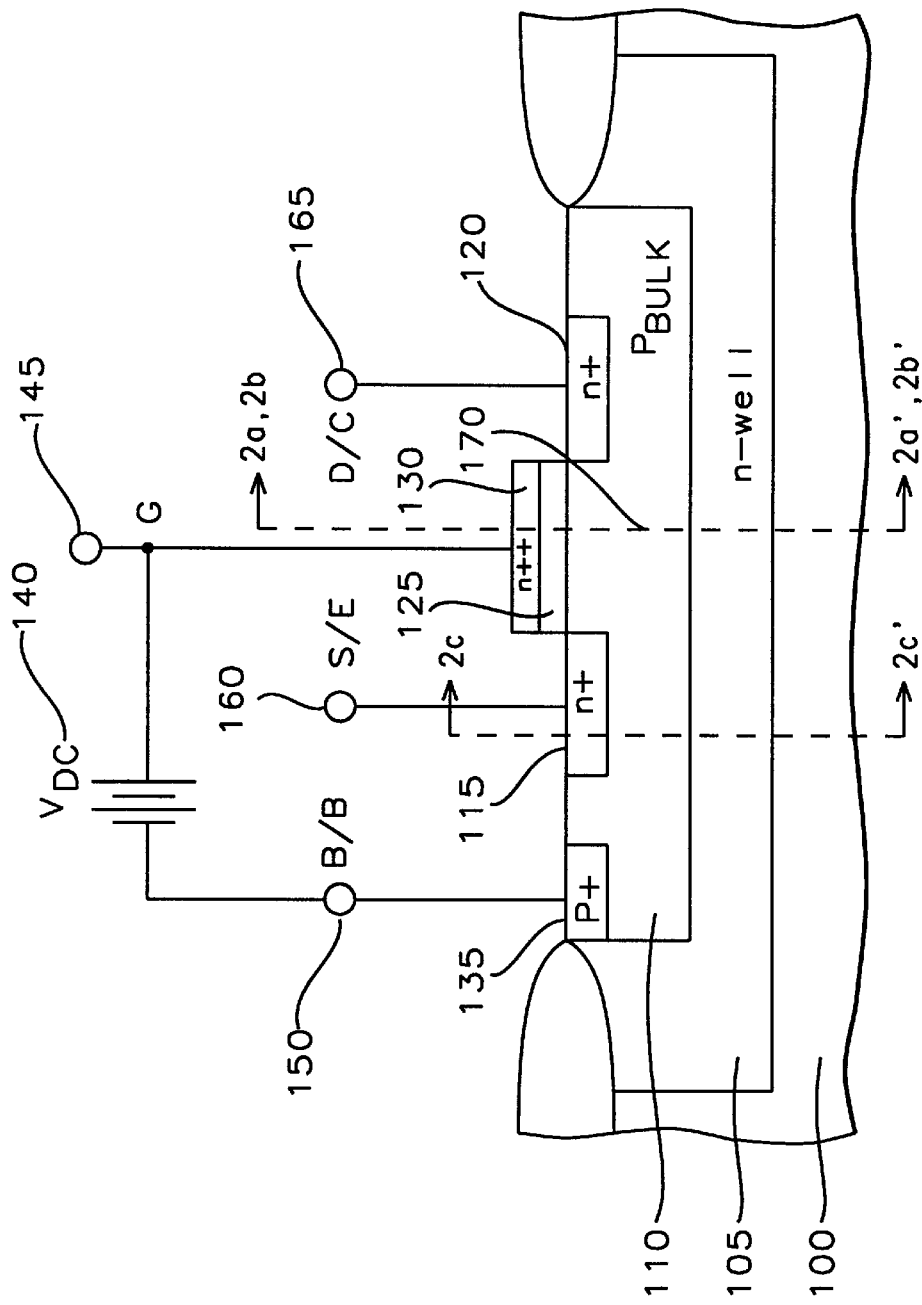
FIG. 1 – Prior Art

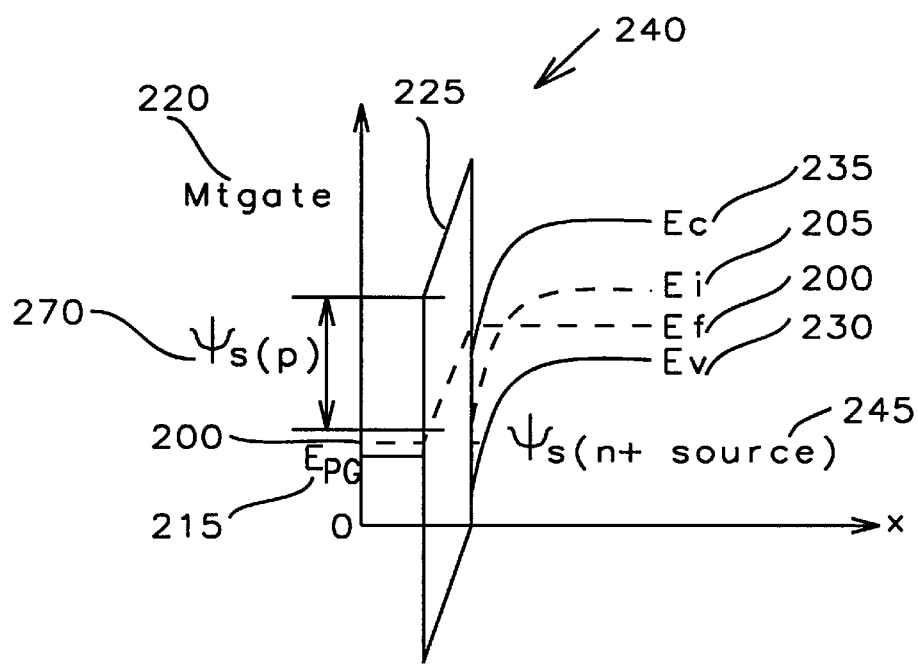
FIG. 2a – Prior Art
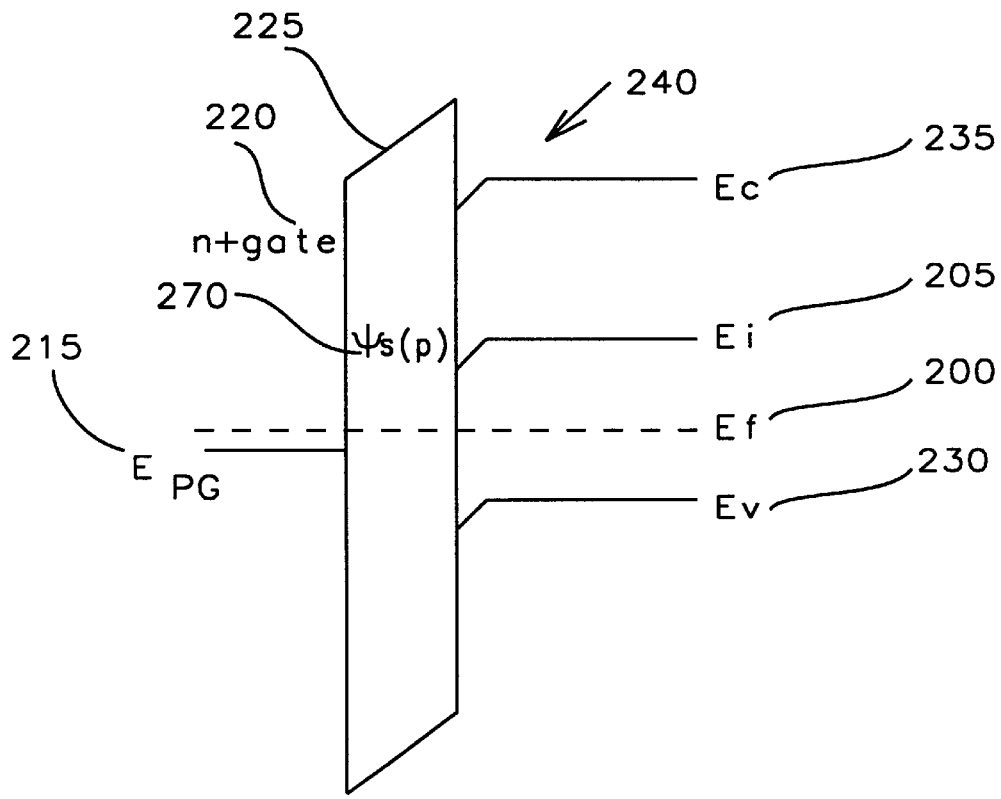
FIG. 2b – Prior Art

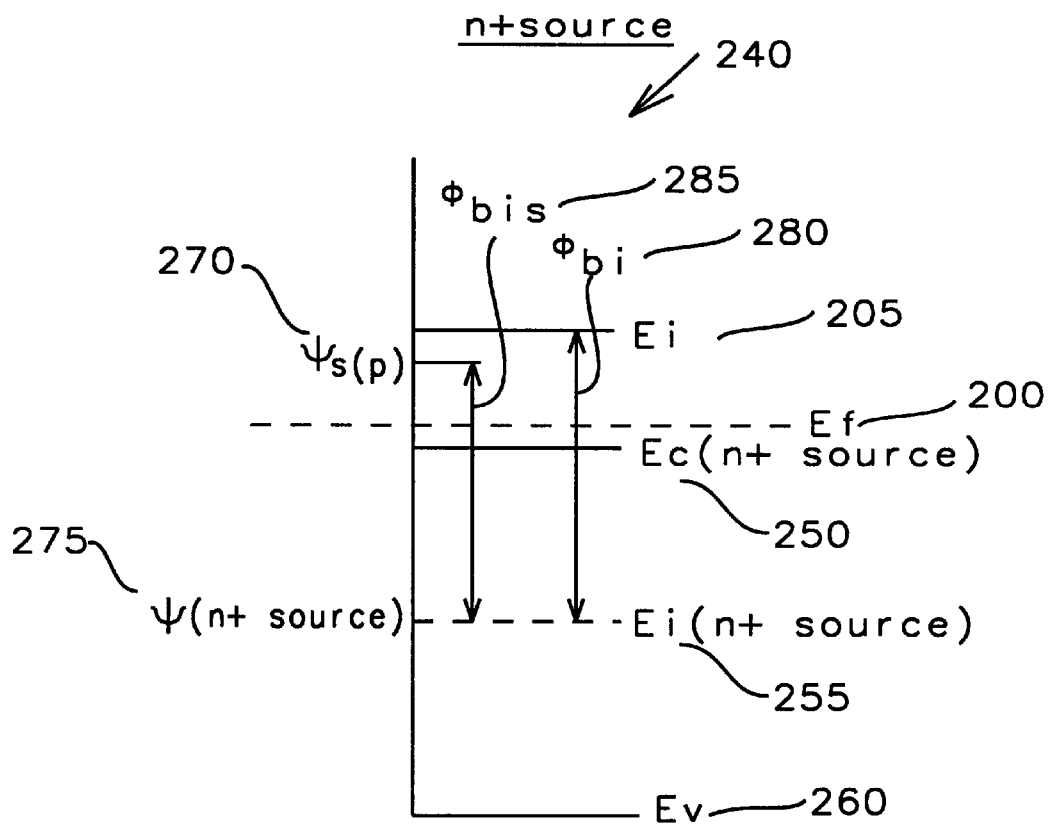
FIG. 2c - Prior Art

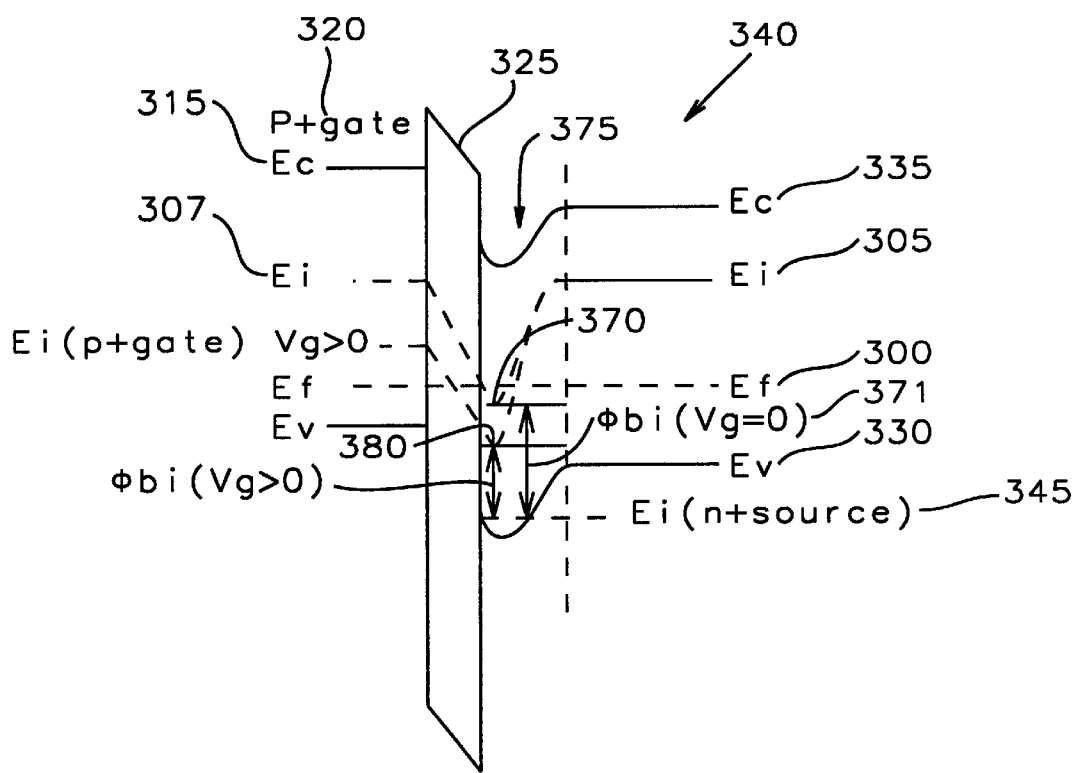
FIG. 3b – Prior Art

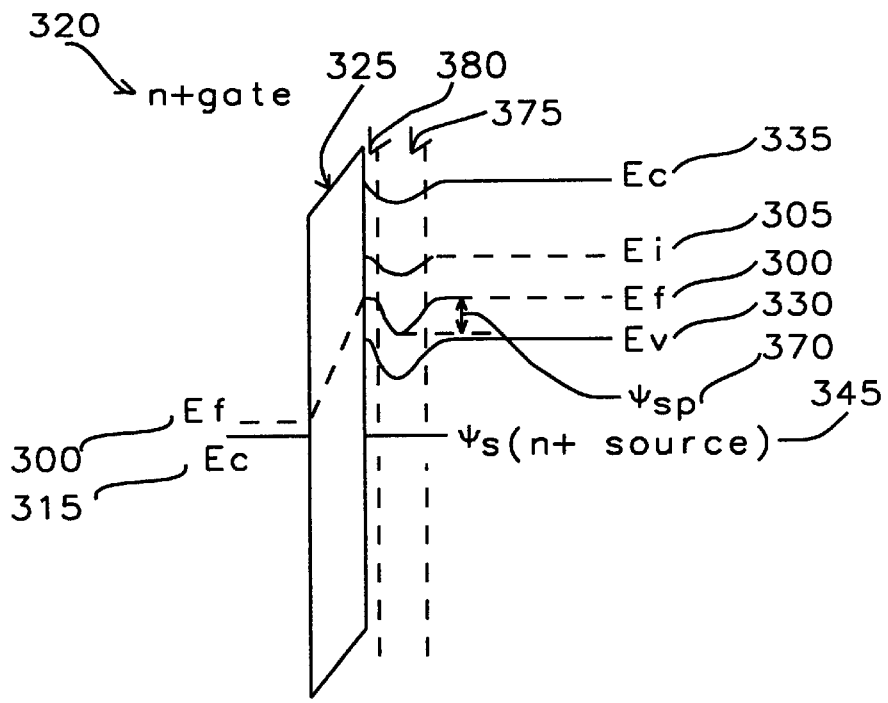
FIG. 4b – Prior Art
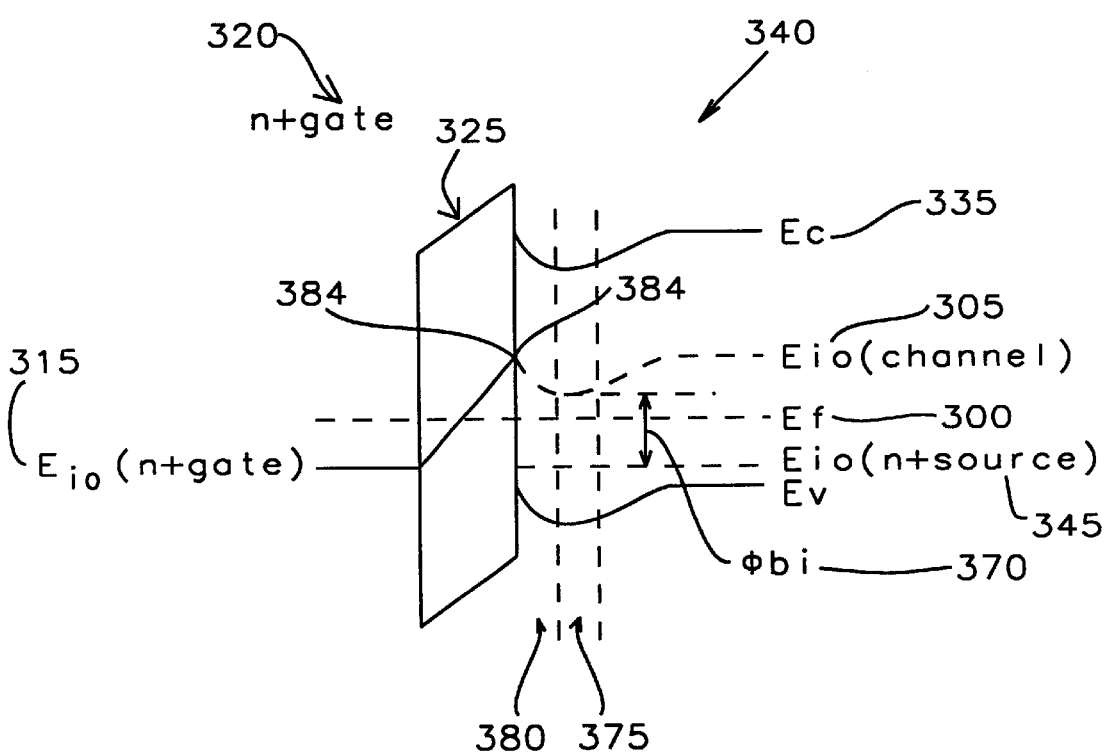
FIG. 4c

FIG. 8 – Prior Art

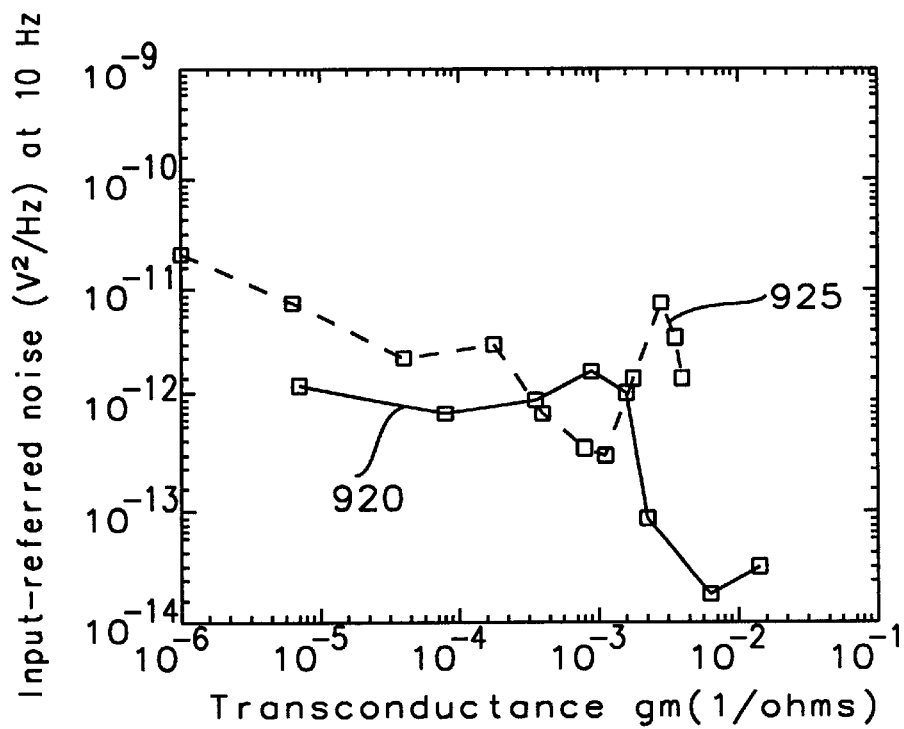
FIG. 10
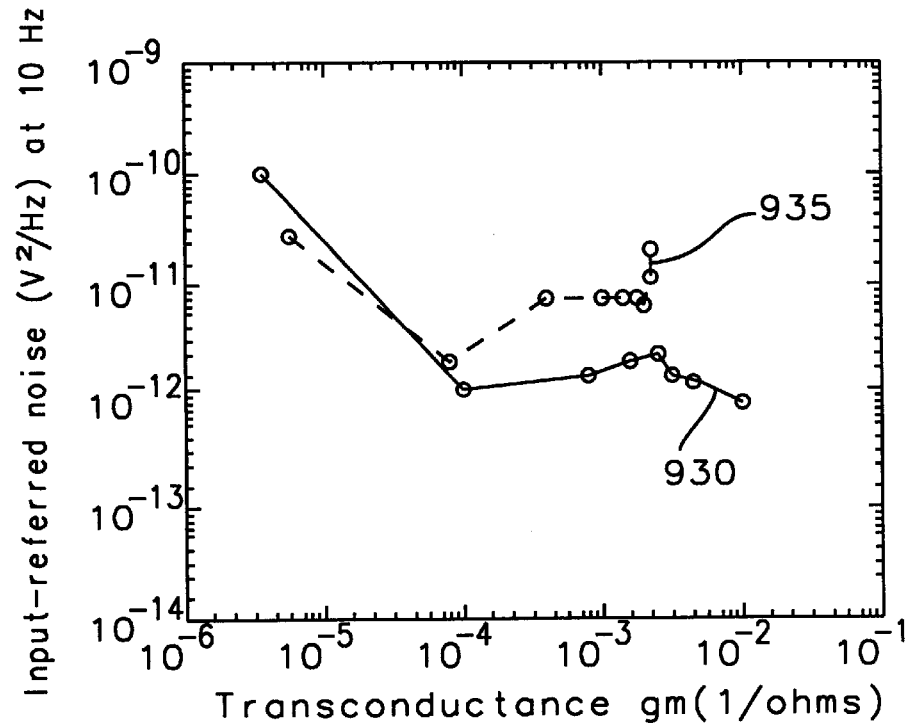
FIG. 11 - Prior Art

BURIED CHANNEL QUASI-UNIPOLAR TRANSISTOR

BACKGROUND OF THE INVENTION

1. Field of the Invention

This invention relates to semiconductor devices. More particularly this invention relates to Metal Oxide Semiconductor (MOS) field effect transistors (FET) connected to function as a combination of a lateral bipolar transistor and an FET.

2. Description of the Related Art

The structure of an MOSFET as shown in FIG. 1 is fundamental in the implementation of integrated circuits. An n-type material is implanted to a low concentration into the surface of a p-type semiconductor substrate 100 to form an n-type diffusion well 105. A p-type material is then implanted to a low concentration into the n-type diffusion well 105 to form a p-type bulk region 110 is of the MOSFET. The p-type material is then implanted to a high concentration in the p-type bulk region 110 to form a low resistivity p-type contact 135 to the bulk electrode 150. The n-type material is further implanted to a high concentration to form the source region 115 and the drain region 120. The source region 115 is connected to the source electrode 160 and the drain region 120 is connected to the drain electrode 165.

An insulating layer generally of silicon dioxide (SiO2) is deposited on the surface of the semiconductor substrate 100 between the source region 115 and the drain region 120 above the channel region 170 to form the gate oxide 125. A conducting material such as a metal or a highly doped polysilicon is deposited on the gate oxide to form the gate 130, which is attached to the gate electrode 145.

FIG. 2a shows the energy band diagram of the MOSFET with the biasing voltage source 140 set to a voltage level of zero volts. This effectively has the p-bulk 110 is connected directly from the bulk terminal 150 to the source terminal 160 to the source 115. The energy band diagram illustrates the energy levels beginning at the n+ highly doped polysilicon gate 220 and proceeding vertically through gate oxide 225 into the p-type bulk region 240.

The energy level required for conduction within the n+ highly doped polysilicon gate 220 is the energy level $E_{pg}$ 215. The energy level where the number of electrons in the conduction energy band $E_c$ 235 is equal to the number of holes in the valance band is the Fermi level $E_f$ 200.

The energy levels for the conduction band and the valance band within the gate oxide 225 are very large relative to the energy levels under consideration in this Figure. The energy level of the conduction bank $E_c$ 235 begin to lower near the surface of the p-type bulk 240 and rises within the body of the p-type bulk 240. Similarly the energy level of the valance band $E_v$ 230 begins at a lower level at the surface of the p-type bulk 240 and rises within the body of the p-type bulk 240 in parallel with the energy level of the conduction band $E_c$ 235. The level of the middle of the gap between the energy level of the conduction band $E_c$ 235 and the energy level of the valance band $E_v$ 230 is the intrinsic Fermi level $E_i$ 205.

The built-in voltage of the n+ source at the junction of the n+ source 115 of FIG. 1 and the p-type bulk 110 of FIG. 1 in the area of the channel region 170 of FIG. 1 is denoted as $\psi_{s(n+\ source)}$ 245. The amount of energy necessary to begin conduction within the p-type bulk 240 of the built-in voltage is the amount of difference of the intrinsic Fermi level $\psi_{sp}$ at the surface of the p-type bulk 225 and within the body of the p-type bulk 240. The threshold voltage is then a function of the built-in voltage of the n+ source $\psi_{(n+\ source)}$ and the built-in voltage $\psi_{sp}$ of the p-type bulk 240.

The MOSFET as shown in FIG. 1 can be configured as shown in U.S. Pat. No. 4,089,022 (Asai et al.) and U.S. Pat. No. 4,999,518 (Dhong et al.) as what is termed in this invention as a lateral quasi-unipolar transistor. The drain region 120 is the collector, the source region 115 is the emitter of the transistor, and the p-type bulk region 110 is the base of the bipolar transistor. Both Asai et al. and Dhong et al. describe use of the gate 130 to create an FET channel voltage drop.

Asai et al. (col. 9 line 57–col. 10 line 37, FIGS. 23, 26, 29, 31) describes placing a biasing voltage source $V_{DC}$ 140 between the gate 130 and the base/bulk region 110. The electric field created between the gate 130 and the base/bulk region 110 will effectively create a transistor having two built-in voltages as shown in FIGS. 2b and 2c. FIG. 2b shows the energy band diagram of the MOSFET of FIG. 1 configured according to Asai et al. from the gate 220 through the gate oxide 225, and into the surface of the semiconductor substrate 240. The energy band diagram have the biasing voltage source $V_{DC}$ 140 set to 0 volts effectively connecting the base/bulk region 110 of FIG. 1 to the gate 130.

As is shown in FIG. 2b compared with FIG. 2a, the Fermi level $E_f$ 200 becomes flat and the energy levels of the conduction band $E_c$ 235, the valance band $E_v$ 230, and the intrinsic Fermi level $E_i$ 205 are lowered. Thus the emitter level of the built-in voltage $\psi_{sp}$ between the channel region at the surface of the p-type bulk 240 and the body of the p-type bulk 240 is also lowered.

FIG. 2c shows the energy levels within the n+ source 115 of FIG. 1 of the conduction band $E_c$ 250, the valance band $E_{v(n+\ source)}$ 260, and the intrinsic Fermi band $E_{i(n+\ source)}$ 255. The built-in voltage for the bulk $\phi_{bi}$ 280 is determined by the formula:

$$\phi_{bi} = E_{i(pbulk)} - E_{i(n+\ source)} - V_1$$

where:

$E_{i(pbulk)}$ is the intrinsic Fermi voltage of the body of the p-type bulk 240 of FIG. 2b.

$E_{i(n+\ source)}$ is the intrinsic Fermi voltage of the n+ source of FIG. 2c.

$V_1$ the voltage of the biasing voltage source $V_{DC}$ 140 of FIG. 1.

The built-in voltage at the surface $\phi_{bis}$ 285 is determine by the formula:

$$\phi_{bis} = [\psi_{sp} - \psi_{(n+\ source)} - V_1]$$

where:

$\psi_{sp}$ is the interface potential of the p-type bulk 240 and the body of the p-type bulk 240.

$\psi_{s(n+\ source)}$ 275 is the interface potential of the n+ source of FIG. 2c.

It is apparent that the built-in voltage $\phi_{bis}$ 285 at the surface of the p-type bulk 240 and the built-in voltage $\phi_{bis}$ 280 of the body of the p-type bulk 240 can be lowered with an increase in the voltage level V1 of the biasing voltage source 140 of FIG. 1.

In radio frequency (RF) applications, the level of noise sources from devices and circuits determine the sensitivity of receivers. Flicker noise or 1/f noise is associated with contamination and crystal defects in the junction between the base/bulk region 110 of FIG. 1 and the emitter/source region 115 or at the surface of base/bulk region 110 in the channel region 170 at the interface of the semiconductor substrate 100 and the gate oxide 125. The more homogeneous the medium of conduction of current through the base/bulk region 110 the less the flicker noise of 1/f noise. The flicker noise or 1/f noise is thus proportional to the number of carriers passing under the gate oxide 225. Since the built-in voltage at the surface $\phi_{bis}$ 285 is smaller than the built-in voltage for the bulk $\phi_{bi}$ 280, more carriers are flowing along the surface, making the flicker noise or 1/f noise greater.

SUMMARY OF THE INVENTION

On object of this invention is to provide a buried channel lateral quasi-unipolar transistor.

Another object of this invention is to provide a buried channel lateral quasi-unipolar transistor having low flicker or 1/f noise.

To accomplish these and other objects a buried channel lateral quasi-unipolar transistor has a bulk region formed of a material of a first conductivity type (for instance a p-type material) implanted to a low concentration into a surface of a semiconductor substrate to form a base of the quasi-unipolar transistor. The bulk region is implanted to a depth of approximately 0.8 $\mu$m with the material of the first conductivity type to a concentration of approximately $1 \times 10^{17}$ holes/cm$^3$.

The buried channel lateral quasi-unipolar transistor has a drain region formed of a material of a second conductivity type (for instance an n-type material) implanted to a high concentration into the bulk region to form a drain/collector of the quasi-unipolar transistor. A source region is placed at a distance from the drain region and formed of the material of the second conductivity type implanted to a high concentration into the bulk region to form a source/emitter of the quasi-unipolar transistor. The source region and the drain region are implanted to a depth of approximately 0.25 $\mu$m with the material of the second conductivity type to a concentration of from approximately $1 \times 10^{20}$ electrons/cm$^3$ to approximately $5 \times 10^{20}$ electrons/cm$^3$.

A channel region is formed of the material of the material of the second conductivity type implanted to a low concentration into the bulk region between the source region and the drain region to provide a low resistivity conduction channel between the drain/collector and the source/emitter. The channel is implanted to a depth of approximately 50 nm from the surface of the semiconductor substrate with the material of the second conductivity type implanted to a concentration of approximately $5 \times 10^{17}$ electrons/cm$^3$.

A gate oxide is placed on the surface of the semiconductor substrate immediately above the channel region. Then a gate electrode of a conductive material such a highly doped polysilicon is deposited on the gate oxide above the channel region. The buried channel lateral quasi-unipolar transistor has a biasing voltage source connected between the gate electrode and the bulk region to lower a built-in voltage of the quasi-unipolar transistor. The biasing voltage source has a voltage level of 0V effectively connecting the base of the quasi-unipolar transistor to the gate electrode. The range of the biasing voltage source can be from 0V to approximately 0.7V. Any voltage much greater than 0.7V will cause the junction of the base/bulk region and the source/emitter region to turn the quasi-lateral unipolar transistor completely on.

The buried channel lateral quasi-unipolar transistor further may have an accumulation region formed of the material of the first conductivity type implanted to the low concentration between the channel region and the surface of the semiconductor substrate to cause a current that flows from the drain/collector to the source/emitter to flow within the channel region rather than at the surface of the semiconductor substrate. The accumulation region has a depth of approximately 50 nm from the surface of the semiconductor substrate and is implanted to a concentration of approximately $1 \times 10^{17}$ holes/cm$^3$.

The base width of the quasi-unipolar transistor that is the distance between the drain region and the source region is less than 1.0 $\mu$m, preferably less than 0.1 $\mu$m.

The buried channel lateral quasi-unipolar transistor may be placed in a diffusion well of the material of the second conductivity type implanted to the low concentration into the surface of the semiconductor substrate into which a bulk region is implanted.

BRIEF DESCRIPTION OF THE DRAWINGS

FIG. 1 is a cross sectional diagram of a surface channel MOSFET configured as a lateral quasi-unipolar transistor of the prior art.

FIG. 2a is an energy band diagram of a surface channel MOSFET of the prior art.

FIG. 2b is an energy band diagram of a quasi-unipolar transistor through the gate, gate oxide, and base/bulk region of the prior art.

FIG. 2c is an energy band diagram of a quasi-unipolar transistor through the n+ source of the prior art.

FIG. 3b is an energy band diagram of the first embodiment of the buried channel lateral quasi-unipolar transistor of this invention as observed through the gate, gate oxide, buried channel, and base/bulk region.

FIG. 4b–4c are an energy band diagrams of the second embodiment of the buried channel lateral quasi-unipolar transistor of this invention as observed from the gate, through the gate oxide, the p-type overlayer, the buried channel, and the base/bulk region.

FIG. 10 is a graph of the amplitude of the input referred noise of the buried channel MOSFET of the prior art and the input referred noise of the buried channel lateral quasi-unipolar transistor of this invention versus frequency.

FIG. 11 is a graph of the input referred noise versus transconductance for a surface channel MOSFET and a surface channel lateral quasi-unipolar transistor of the prior art.

DETAILED DESCRIPTION OF THE INVENTION

Figure 3A:
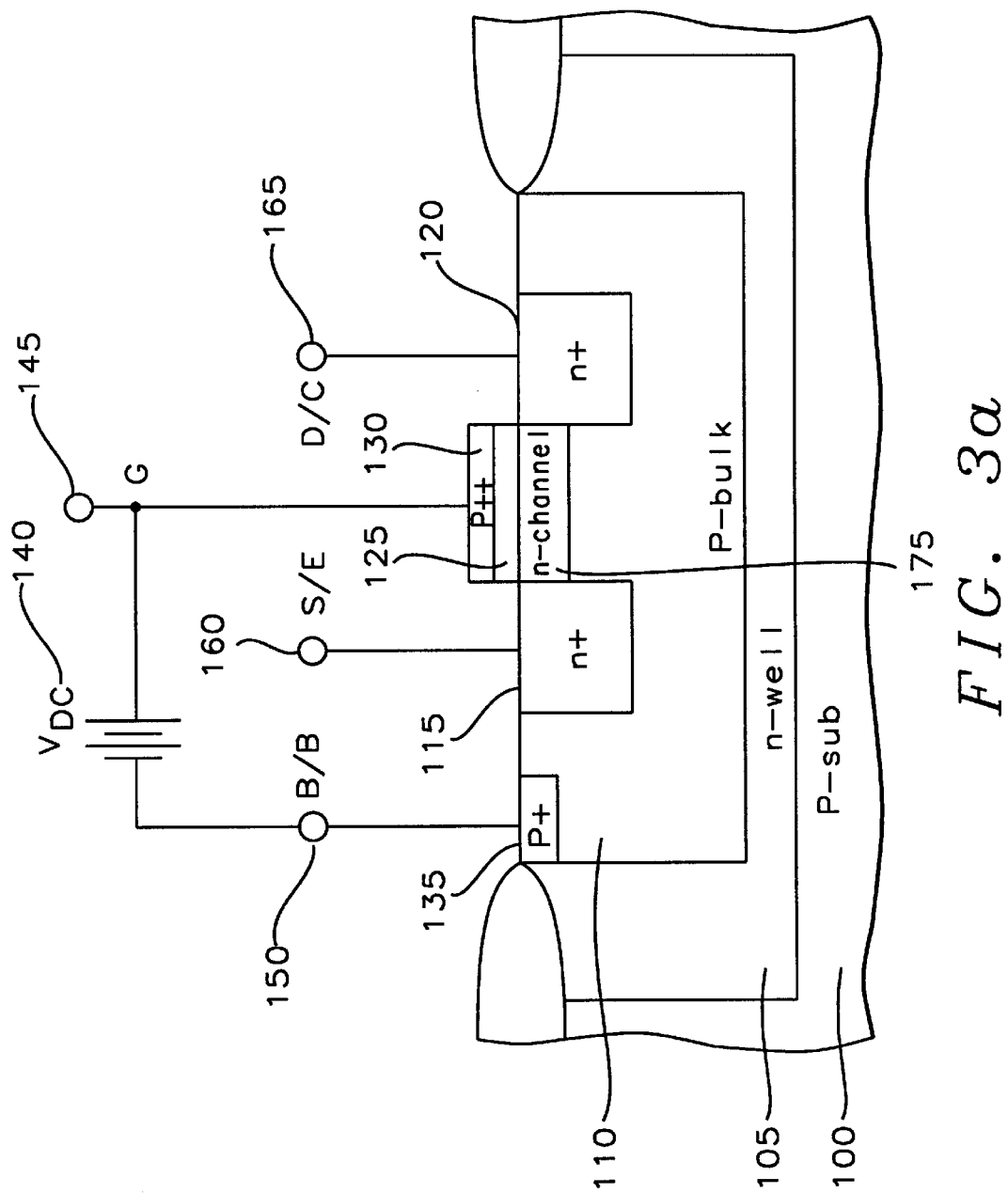
FIG. 3a is a cross sectional diagram of a first embodiment of a buried channel lateral quasi-unipolar transistor of this invention.
Figure 4A:
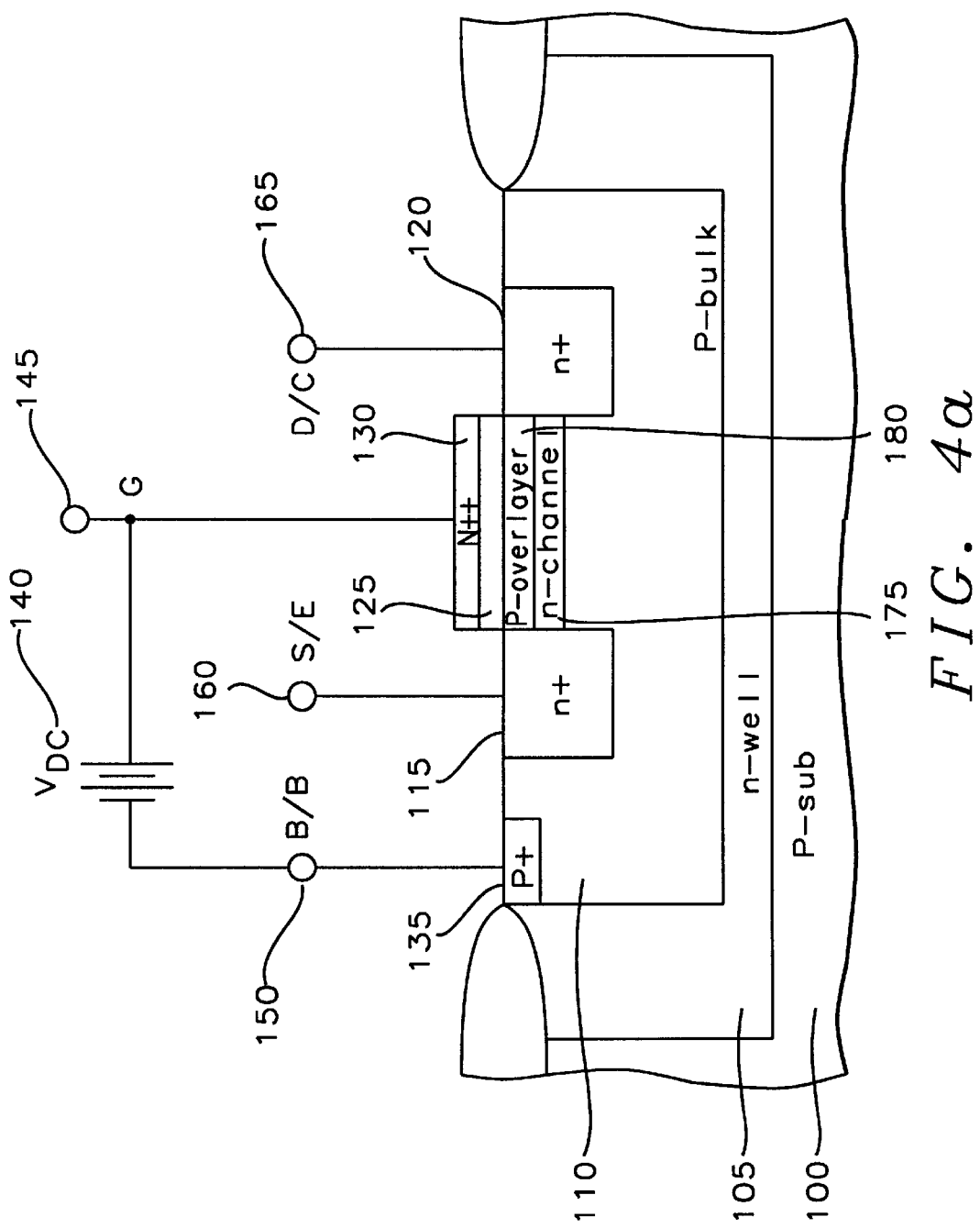
FIG. 4a is a cross sectional diagram of a second embodiment of the buried channel lateral quasi-unipolar transistor of this invention.

The structure of a buried channel MOSFET is well known in the art. The structure is shown in FIGS. 3a and 4a and described in U.S. Pat. No. 4,000,504 (Berger), U.S. Pat. No. 4,549,193 (Malki et al.), U.S. Pat. No. 5,512,771 (Hiroki et al.), and U.S. Pat. No. 5,548,143 (Lee). As above described the n-well 105 is formed by the implantation of an n-type material to a lightly doped concentration in the p-type substrate 100. Within the n-well 105, a p-type material is implanted to lightly doped concentration to form the p-type bulk region 110.

The p-type material is then implanted to a heavily doped concentration for a low resistivity contact 135 to the p-type bulk 110. The contact 135 is then connected to the bulk terminal 150.

The n-type material is then implanted to highly doped concentration into the surface of the semiconductor substrate 100 within the p-type bulk to form the source region 115 and drain region 120 of the buried channel MOSFET. The source region 115 is further connected to the source terminal 160 and the drain region 120 is connected to the drain terminal 165. The n-type material is then implanted to moderately doped concentration to form the n-type buried channel region 170. The buried channel region 170 may be implanted further into the surface of the semiconductor substrate 100 as shown in FIG. 4a. The p-type material is then implanted to a low concentration into the surface of the semiconductor substrate 100 above the buried channel 175 to form an accumulation region 180.

The insulating layer is deposited on the surface of the p-type semiconductor substrate 100 above the channel region 175 and between the source region 115 and the drain region 120 to form the gate oxide 125.

A very heavily doped polysilicon material is deposited on the gate oxide 125 to form the gate 130. In the case of FIG. 3a, where the channel region 175 is at the surface of semiconductor substrate 100, the very heavily doped polysilicon is doped with the p-type material. However, in FIG. 4a, the buried channel region 175 is placed beneath the surface of the semiconductor substrate 100 and the accumulation region 180 is at the surface of the semiconductor substrate 100, the very heavily doped polysilicon is doped with the n-type material. The gate 130 is further connected to the gate terminal 145.

FIGS. 3b shows an energy band diagrams of the buried channel MOSFET's of the prior art. FIG. 3b illustrates the energy band diagrams from the p+-polysilicon gate 320, through the gate oxide 325 and the buried channel 375 into the p-type bulk 340. The intrinsic Fermi voltage of the source region 115 $E_{in(+\ source)}$ 345 is invariant, while the intrinsic Fermi voltage of the buried channel 175 Ei 305 has a minimum 370 at a finite depth from the interface of the gate oxide 325 and the buried channel region 375. The difference between the intrinsic voltage $E_i$ 305 of the buried channel region 375 and the intrinsic Fermi voltage $E_{i(n+\ source)}$ 345 of the source region 115 is the built in voltage $\phi_{bi}$ ($V_g$=0) 371. When a voltage source $V_g$ is applied to the gate terminal 145 of FIG. 3a and thus to the gate 32, the intrinsic Fermi voltage $E_i$ 307 of the gate 320 is lowered to the level $E_i$ 309. The intrinsic Fermi voltage $E_I$ 305 in the buried channel region 375 now has a lower minimum 380. The built in voltage $\phi_{bi}$ ($V_g$=0) 371 reduces now to a new built in voltage $\phi_{bi}$ ($V_g$>0) 381. A current density within the buried channel region 375 increase exponentially following the relationship of $$J \propto \exp\frac{-q\phi_{bi}}{kt}$$

where:

$\dfrac{kt}{q}$ is the thermal equivalent of voltage.

It is apparent to those skilled in the art that the majority of the current flows through the potential minimum. This the device is termed a buried channel MOSFET. It is further apparent, that the location of the minimum shifts toward the interface of the gate oxide 325 and the buried channel region 375 as the gate voltage $V_g$ increases. As the gate voltage becomes sufficiently large, the buried channel MOSFET will, in fact become a surface channel device.

Figure 3C:
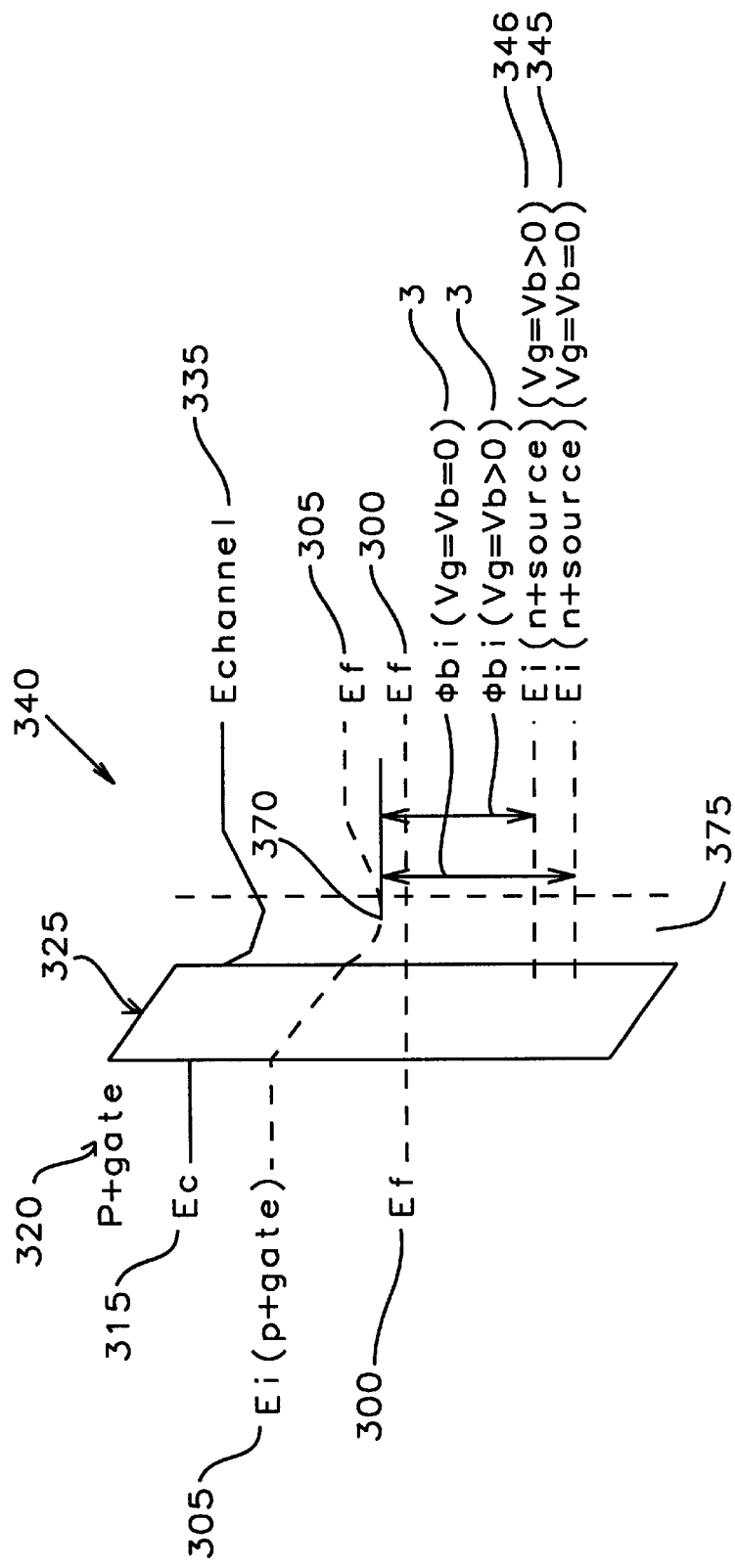
FIG. 3c is an energy band diagram of the first embodiment of the buried channel lateral quasi-unipolar transistor of this invention as observed through the gate, gate oxide, buried channel, and base/bulk region, comparing the intrinsic Fermi energy bands for the voltage applied to the base/bulk equal to the voltage applied to the gate equal to zero volts and the voltage applied to the base/bulk equal to the voltage applied to the gate greater than to zero volts.

Referring back to FIG. 3a, the biasing voltage source $V_{DC}$ 140 is connected from the gate terminal 145 to the bulk terminal 150 to create the buried channel lateral quasi-unipolar transistor. The first embodiment of the quasi-unipolar transistor is shown in FIG. 3a, where the buried channel is within the n-channel 175 but is away from the interface of the gate oxide 125 and the surface of the semiconductor substrate 100. FIG. 3c shows the energy band diagram of the first embodiment of the buried channel lateral quasi-unipolar transistor of this invention for a gate voltage $V_g$ equal to the voltage applied to the base/bulk 110 equal to zero volts ($V_g=V_b=0$) and for a gate voltage $V_g$ equal to the voltage applied to the base/bulk 110 greater to zero volts ($V_g=V_b>0$). As is apparent, the built-in voltage $\phi_{bi}$ ($V_g=V_b=0$) 376 decreases to the level $\phi_{bi}$ ($V_g=V_b>0$) 381 as the gate voltage $V_g$ that is equal to the voltage applied to the base/bulk 110 increases. It should be noted that the location of the minimum 370 remains constant and does not shift toward the interface of the gate oxide 325 and the buried channel region 375. The buried channel later quasi-unipolar transistor remains a buried channel device regardless of all gate biasing.

Figure 3D:
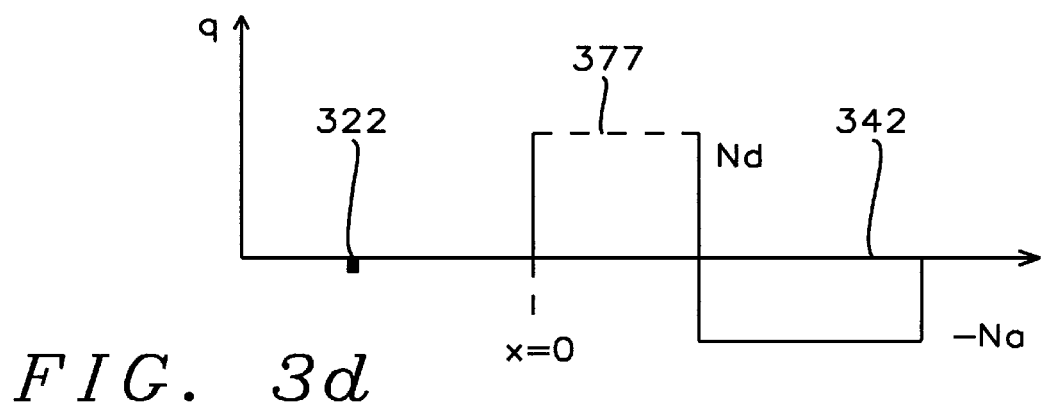
FIG. 3d is a graphical representation of the doping profile of the first embodiment of the buried channel lateral quasi-unipolar transistor of this invention as observed through the gate, gate oxide, the buried channel, and base/bulk region.

FIG. 3d shows a representative doping profile of the first embodiment of the buried channel lateral quasi-unipolar transistor. The gate 322 is a p-type polysilicon doped to a concentration of from approximately $1\times10^{20}$ holes/cm$^3$ to approximately $5\times10^{20}$ holes/cm$^3$, preferably $2\times10^{20}$ holes/cm$^3$. The buried channel is implanted with the n-type material to a concentration of from approximately $1\times10^{17}$ electrons/cm$^3$ to approximately $1\times10^{18}$ electrons/cm$^3$, preferably $5\times10^{17}$ electrons/cm$^3$. The p-type base/bulk 342 is implanted to a concentration of from approximately $1\times10^{16}$ holes/cm$^3$ to approximately $2\times10^{17}$ holes/cm$^3$, preferably $1\times10^{17}$ holes/cm$^3$.

Figure 3E:
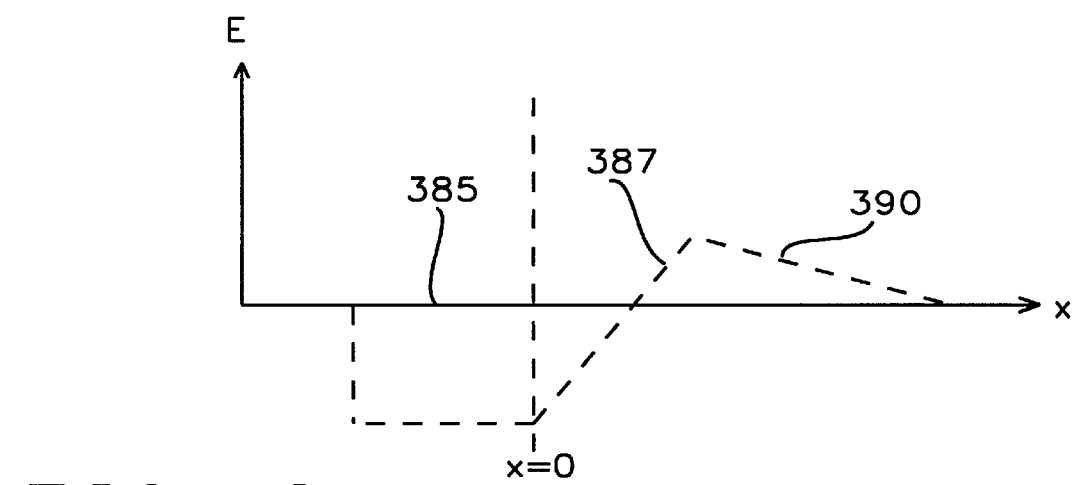
FIG. 3e is a graph of the energy field strength as observed from the gate, through the gate oxide, the buried channel, and base/bulk region of the first embodiment of the buried channel lateral quasi-unipolar transistor of this invention.

These electron/hole densities create induced energy fields as shown in FIG. 3e. The energy field 385 from the p-type polysilicon gate through gate oxide is approximately $-300$ KV/cm. The field increases 387 through the buried channel to junction of the buried channel and the p-type base/bulk, where the energy field is approximately 100 KV/cm. The energy field will then decrease 390 to zero at the junction of the p-type base/bulk and the n-well 110 of FIG. 3a.

Figure 3F:
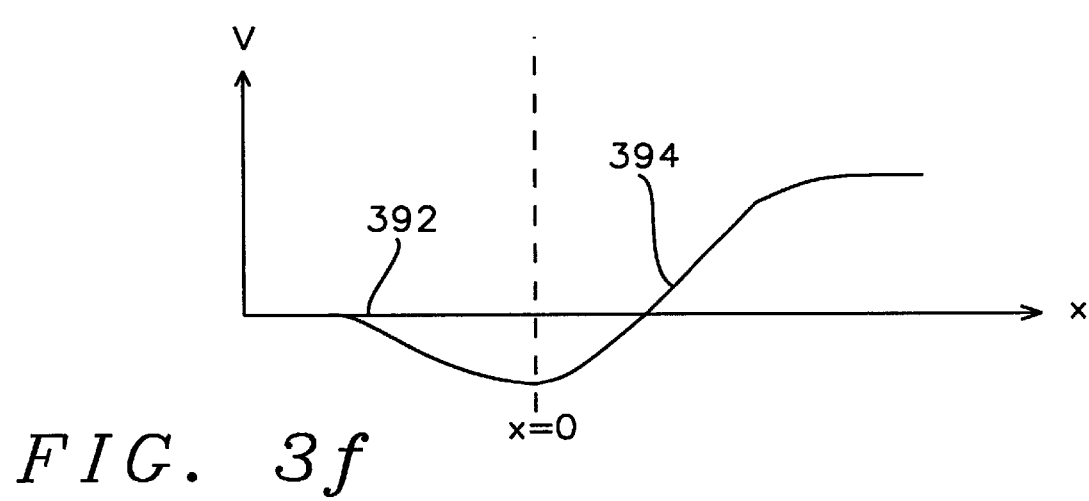
FIG. 3f is a graph of the built-in voltage observed from the gate through the gate oxide, the buried channel, and the base/bulk region.

The graph of FIG. 3f shows the resultant voltage potentials.

The second embodiment of the buried channel lateral quasi-unipolar transistor is shown in FIG. 4a, where the p-type overlayer 180 is placed at the surface of the semiconductor substrate and the n-type buried channel 175 placed under the p-type overlayer 180.

FIG. 4c shows the energy band diagram of the second embodiment of the buried channel lateral quasi-unipolar transistor of this invention. The built-in voltage $\phi_{bi}$ 370 is, as described above, decreased as the source potential $E_{i(n+source)}$ 345 increases or equivalently the voltage $V_g$ and $V_b$ applied respectively to the gate terminal 145 and the base/bulk terminal 150 of FIG. 4a is increased.

Figure 4D:
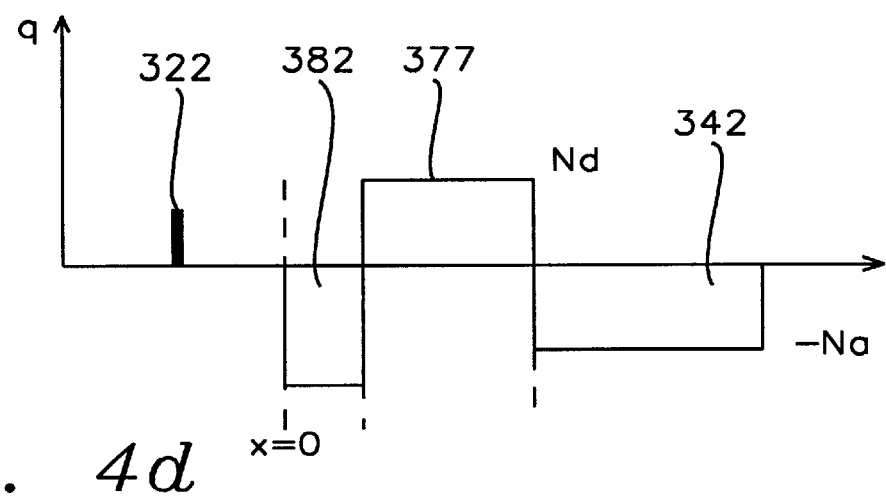
FIG. 4d is a graphical representation of the doping profile of the second embodiment of the buried channel lateral quasi-unipolar transistor of this invention as observed from the gate, through the gate oxide, the p-type overlayer, the buried channel, and the base/bulk region.
Figure 4E:
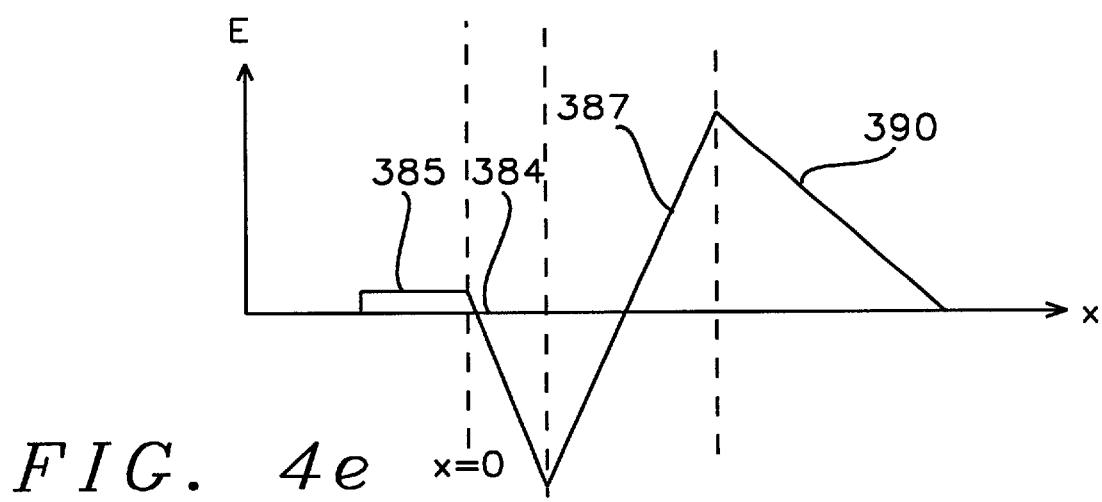
FIG. 4e is a graphical representation of the energy field strength as observed from the gate, through the gate oxide, the p-type overlayer, the buried channel, and the base/bulk region of the second embodiment of the buried channel lateral quasi-unipolar transistor.

FIG. 4d shows a representative doping profile of the second embodiment of the buried channel lateral quasi-unipolar transistor of this invention. The gate 322 in the second embodiment is an n-type polysilicon doped to a concentration of from approximately $1\times10^{20}$ electrons/cm$^3$ to approximately $2\times10^{20}$ electrons/cm$^3$, preferably $2\times10^{20}$ electrons/cm$^3$. The p-type overlayer 382 is implanted with the p-type material to a concentration of from approximately $8.3\times10^{17}$ holes/cm$^3$ to approximately $1\times10^{18}$ holes/cm$^3$, preferably $8.3\times10^{17}$ holes/cm$^3$. The n-type buried channel 377 is implanted with an n-type material to a concentration of from approximately $1\times10^{17}$ electrons/cm$^3$ to approximately $5\times10^{17}$ electrons/cm$^3$, preferably $5\times10^{17}$ electrons/cm$^3$. The base/bulk region 342 is implanted with the p-type material to a concentration of from approximately $3\times^{16}$ holes cm$^3$ to approximately $5\times10^{16}$ holes/cm$^3$, preferably $3\times10^{16}$ holes/cm$^3$.

The above described electron/hole concentration densities create induced energy fields as shown in FIG. 4c. The energy field 385 from the gate through the gate oxide has a magnitude of approximately 200 KV/cm. The energy field 384 through the p-type overlayer 180 will decrease to a level of approximately $-15$ KV/cm at the junction of the p-type overlayer and the buried channel. The energy field 387 then increases through the buried channel to a level of 0.4 KV/cm at the junction of the buried channel and the base/bulk region. The energy level 390 will then decrease through the base/bulk region to a level of approximately zero (0) V/cm at the junction of the base/bulk region and the n-well.

Figure 4F:
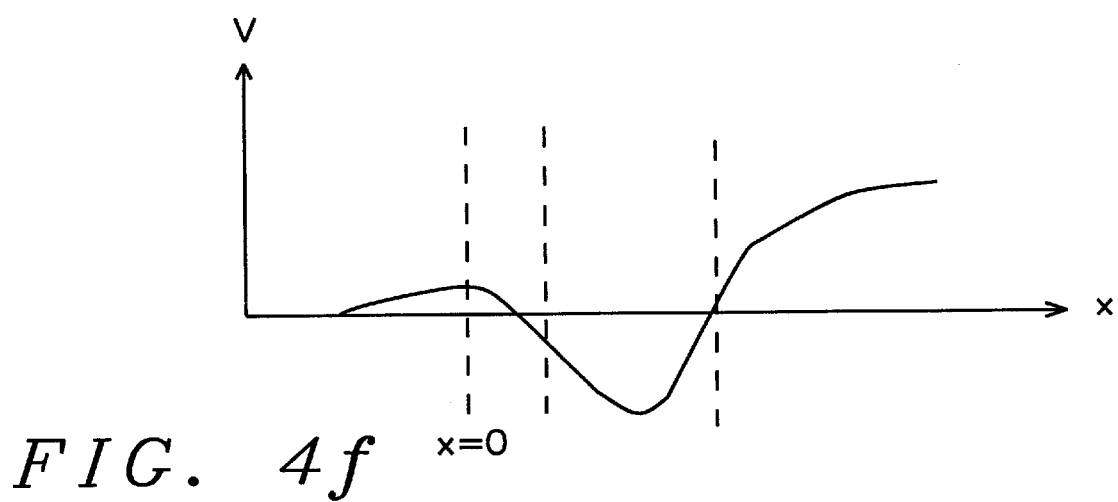
FIG. 4f is a graphical representation of the built-in voltage as observed from the gate, through the gate oxide, the p-type overlayer, the buried channel, and the base/bulk region.

The graph of FIG. 4f shows the resultant voltage potentials. A bias voltage $V_g$ applied to the gate terminal 145 and the base/bulk terminal 150 of FIG. 4a effectively leaves the potential of the buried channel $E_{i(channel)}$ 305 of FIG. 4b unchanged, while moving the potential of the source $E_{i(n+source)}$ up, thus reducing the built in voltage $\phi_{bi}$. This allows the current flowing in the channel to increase exponentially.

Figure 5A:
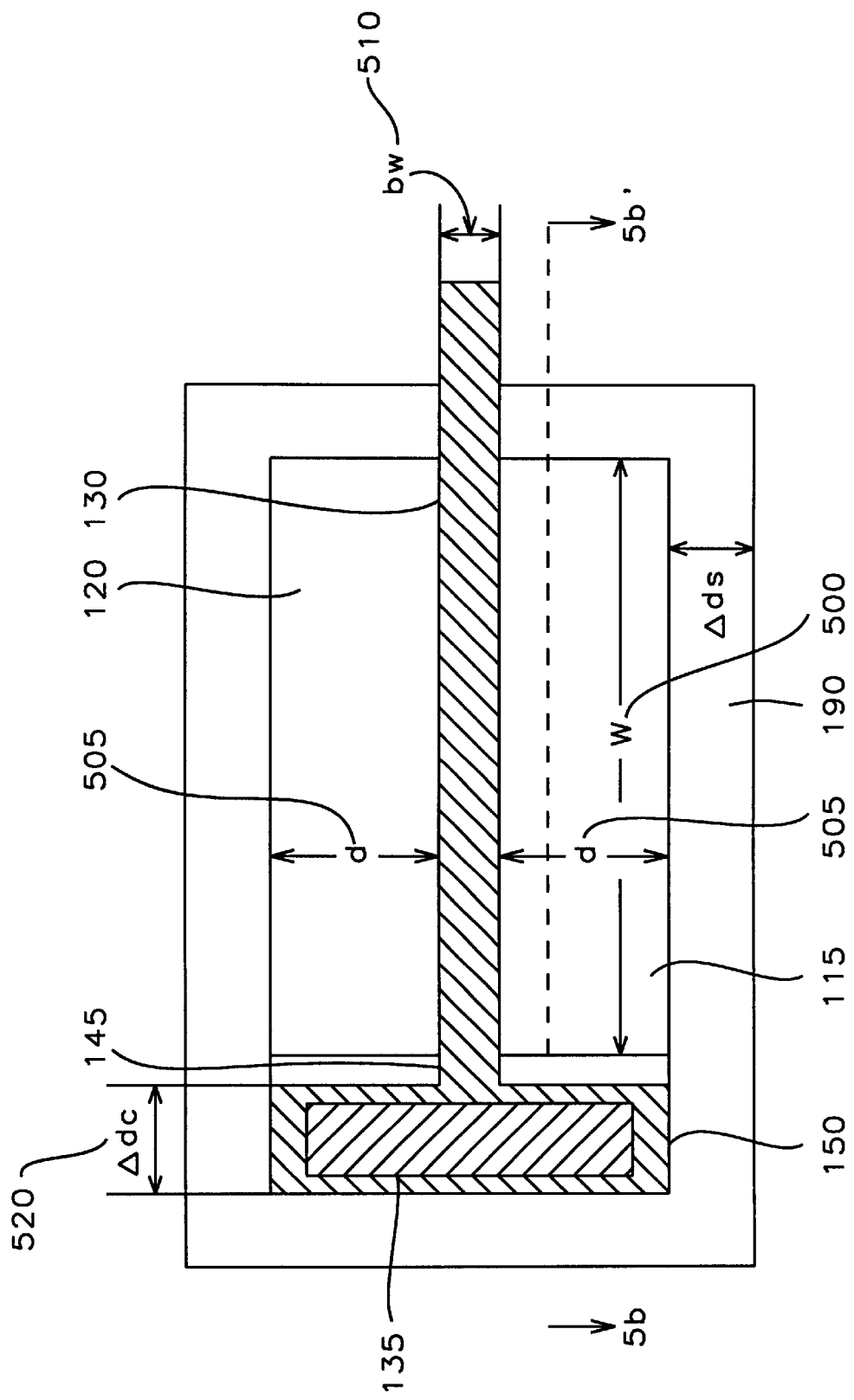
FIGS. 5a and 5b are respectively a top surface view and a cross sectional view of the buried channel lateral quasi-unipolar transistor of this invention defining the approximate dimensions.
Figure 5B:
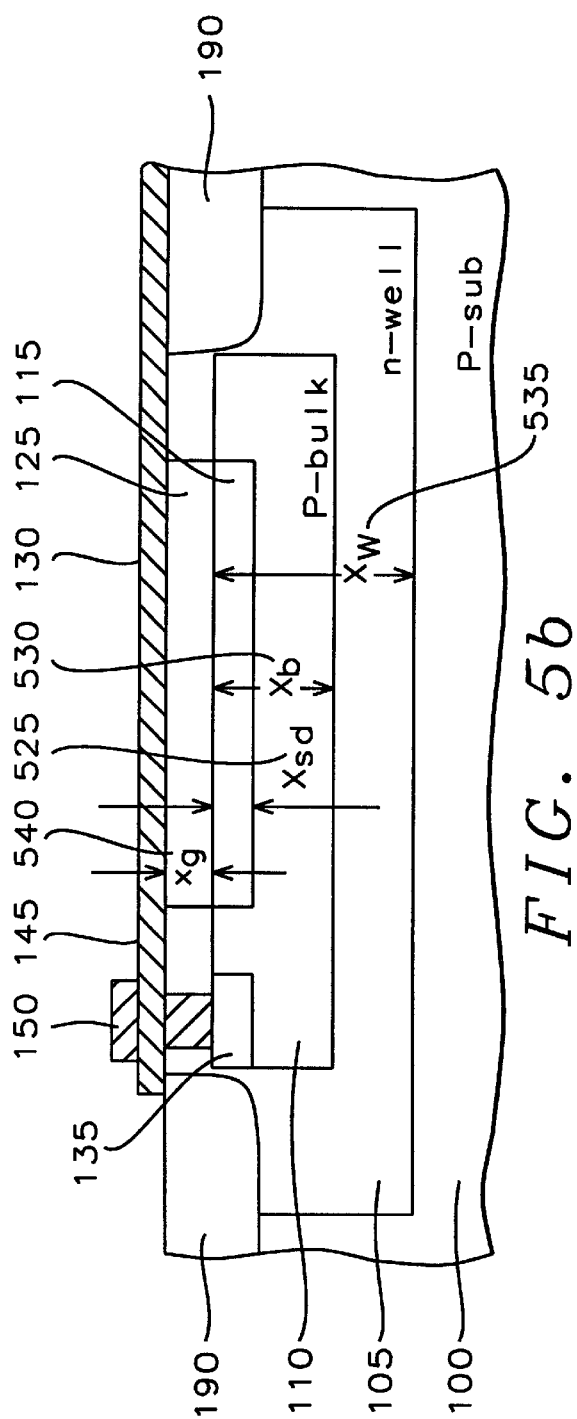

FIGS. 5a and 5b illustrate a representative physical design of a buried channel lateral quasi-unipolar transistor of this invention. In this representation, the biasing voltage source 140 of FIGS. 3a and 4a is brought a level of zero volts and the gate terminal 145 of FIGS. 3a and 4a is connected directly to the base/bulk terminal 150. If any level of voltage of the biasing voltage source 140 is to be at any level other than zero volts the connection between the gate terminal 145 and the base/bulk terminal 150 is severed and the connections to the biasing voltage source 140 are placed at these terminals.

The width w 500 of the source/emitter 115, the gate 130, and drain/collector 120 are from approximately 5 μm to approximately 10 μm. The length d 505 of the source/emitter 115 and the drain/collector 120 is approximately 0.8 μm. The length bw 510 of the gate 130, the n-type buried channel 175 of FIGS. 3a and 4a, and the p-type overlayer 180 of FIG. 4a is less than 1.0 μm, preferably 0.3 μm or less. The buried channel lateral quasi-unipolar transistor is surrounded by an isolation 190 that is an insulating material such as silicon dioxide having a width $\Delta_{ds}$ of approximately 0.5 μm. The width $\Delta_{DC}$ 520 of the base/bulk terminal 150 is approximately 1.2 μm.

The depth Xsd 525 in FIG. 5b of the implantation that forms the source/emitter 115 and the drain/collector 120 is approximately 250 nm. The depth $X_b$ 530 of the implantation that forms the base/bulk 110 is approximately 0.8 μm. The depth Xw 535 of the implantation that forms the n-well 105 is approximately 2.0 μm.

The depth of the n-type buried channel 175 of FIGS. 3a and 4a is approximately 50 nm from the surface of the semiconductor substrate in the first embodiment and the junction of the p-type overlayer 180 of FIG. 4a. The depth of the p-type overlayer 180 of FIG. 4a is approximately 50 nm from the surface of the semiconductor substrate 100.

The gate oxide 125 has a thickness $X_g$ 540 of approximately 50 Å.

Figure 6:
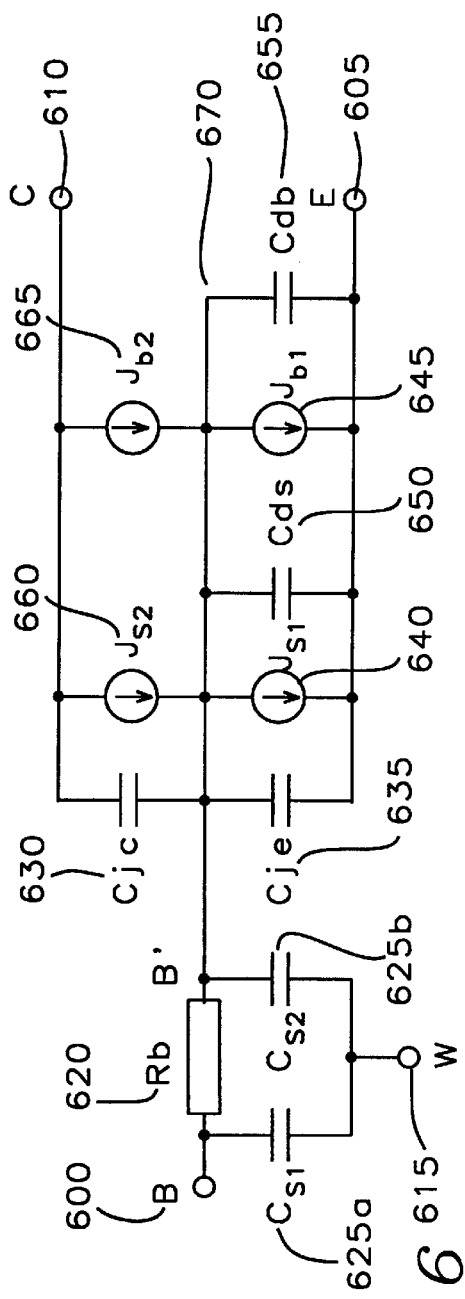
FIG. 6 is a schematic diagram of a transistor model of a buried channel lateral quasi-unipolar transistor of this invention.

The above described geometry and doping concentrations lead to a model of the buried channel lateral quasi-unipolar transistor shown in FIG. 6. This model is operable with any standard circuit simulator such as SPICE, which is well known in the art. The base terminal B 600 represents the base/bulk terminal 150 of FIGS. 4*a* and 4*b*, the emitter E 605 represents the source/emitter 115 of FIGS. 3*a* and 4*a*, and the collector C represents the drain/collector 120 of FIGS. 3*a* and 4*a*.

With continued reference to FIGS. 3*a* and 6, the resistor $R_b$ 620 is the base spreading resistance of the buried channel lateral quasi-unipolar transistor and represents the resistivity of the base/bulk from the base/bulk terminal 150 to the base junction B' 670. The magnitude of the resistor $R_b$ is from approximately 0.5 $\Omega/cm^2$ to approximately 2.0 $\Omega/cm^2$. The resistor $R_b$ can be calculated by the formula:

$$R_b = \rho G$$

where:
$\rho$ is the sheet resistance of the base/bulk region 110 G is a geometrical factor of the base/bulk region. G has a range of from 1.0 to 0.1 typically, but preferably would be smaller.

The capacitor $C_{s1}$ 625*a* is connected from the base terminal B 600 to the well terminal W 615 and the capacitor $C_{s2}$ is connected from the base junction B' 670 to the well terminal W 615. The magnitude of the junction capacitances $C_{s1}$ 625*a* and $C_{s2}$ 625*b* dependent on the area of the interface between the base/bulk region 110 and the n-well 105. The capacitance per unit area $C_{unitarea}$ of the junction capacitances $C_{s1}$ 625*a* and $C_{s2}$ 625*b* is from approximately 0.5 $fF/\mu m^2$ to approximately 0.7 $fF/\mu m^2$. The junction capacitances $C_{s1}$ 625*a* and $C_{s2}$ 625*b* can be determined by the formula:

$$C_{s1} = C_{s2} = \frac{1}{2}[(w + \Delta dc) \times (2d + bw)]C_{unitarea}$$

where:
w is the width 500 of the source/emitter 115, the gate 130, and drain/collector 120.
d is the length 505 of the source/emitter 115 and the drain/collector 120.
$\Delta_{DC}$ is the width 520 of the base/bulk terminal 150.
bw is the length 510 of the gate 130, the n-type buried channel 175.

The buried channel current source $J_{s1}$ 640 represents the current injected laterally in the buried channel 175 from the source/emitter region 115 to the base/bulk region 110. The magnitude of the first surface current source $J_{s1}$ 640 inversely proportional to the length bw 510 of the buried channel 175.

The first bulk current source $J_{B1}$ 645 represents the downward current injection form the junction of the source/emitter 115 to the base/bulk region 110. The magnitude of the first buried current source $J_{B1}$ 645 is dependent on the area of the junction of the source/emitter 115 and the base/bulk region 110. The ratio of the magnitudes of the currents from the buried channel current source $J_{s1}$ 640 and the first bulk current source $J_{B1}$ 645 should be designed to be at least 100, preferably larger.

The second buried channel current source $J_{s2}$ 660 is connected from the collector terminal C 610 to the base junction B' 670. The magnitude of the second surface current source $J_{s2}$ is dependent on the magnitude of the first current source by the function:

$$J_{s2} = \alpha_s * J_{s1}$$

where:
$\alpha_s$ = is the common base current gain of the surface of the buried channel lateral quasi-unipolar transistor and is the ratio of the surface portion of the current from the emitter terminal E 605 to the surface portion of the current into the collector terminal C 610.

The second bulk current source $J_{B2}$ 665 is connected from the collector terminal C60 to the base junction B' 670. The magnitude of the second buried current source $J_{B2}$ 665 is dependent on the magnitude of the first buried current source $J_{B1}$ 645 by the function:

$$J_{B2} = \alpha_b * J_{B1}$$

where:
$\alpha_b$ is the common base current gain of the buried portion of the buried channel lateral quasi-unipolar transistor and is the ratio of the buried portion of the current from the emitter terminal E 605 to the buried portion of the current into the collector terminal C 610.

It will be noted that, because of the drop in the buried channel, the common base current gain of the surface $\alpha_s$ is greater than the common base current gain of the bulk portion $\alpha_b$. Thus, the buried channel portion of the current into the collector terminal C 610 or out of the emitter terminal E 605 will be the dominant current.

The capacitance $C_{jc}$ 630 connected between the collector terminal C 610 and the base junction B' 670 represents the junction capacitance between the drain/collector 120 and the base/bulk region 110. The capacitor $C_{je}$ 635 connected between the emitter terminal E 605 and the base junction B' 670 represents the junction capacitance between the source/emitter 115 and the base/bulk region 110.

The capacitors $C_{ds}$ 650 and $C_{db}$ 655 are connected between the emitter terminal E 605 and the base junction B' 670. The capacitor $C_{ds}$ 650 represents the diffusion capacitance of the surface portion of the source/emitter 115 in the region of the buried channel 175. The capacitor $C_{db}$ 655 represents the diffusion capacitance of the buried portion of the source/emitter 115.

The value of the diffusion capacitors $C_{ds}$ 650 and $C_{db}$ 655 is proportional to the product of the current and the stored charge time constant. Due to the lower barrier in the buried channel 175 of FIG. 3*a* or FIG. 4*a* is orders of magnitude greater than the current in the base/bulk 110 of the buried channel quasi-unipolar transistor of this invention at a specific gate 130 to-source/emitter 115 and base/bulk 110 to source/emitter 115 biasing voltage. Although the stored charge time constant of the base/bulk 110 is about one order larger than the stored time constant of the buried channel 175, the overall diffusion capacitance $C_{ds}$ 650 of the buried channel 175 still dominates the switching speed of the buried channel quasi-unipolar transistor of this invention. As is similar to a surface channel unipolar transistor (MOSFET), the small stored time constant of the buried channel 175 allows the buried channel quasi-unipolar transistor to operate at a much higher frequency than an equivalently designed lateral PNP bipolar transistor.

When a bias voltage $V_{be}$ is applied to the base/bulk terminal 150 and simultaneously to the gate terminal 145, the magnitude of the currents from the buried channel current source $J_{s1}$ 640 and the first bulk current source $J_{B1}$ 645 increase exponentially with the slope that is:

$$\frac{qV_{be}}{kT}.$$

This slope is greater than for a MOSFET device, thus providing a higher a transconductance for a buried channel quasi-unipolar transistor of this invention.

Figure 7:
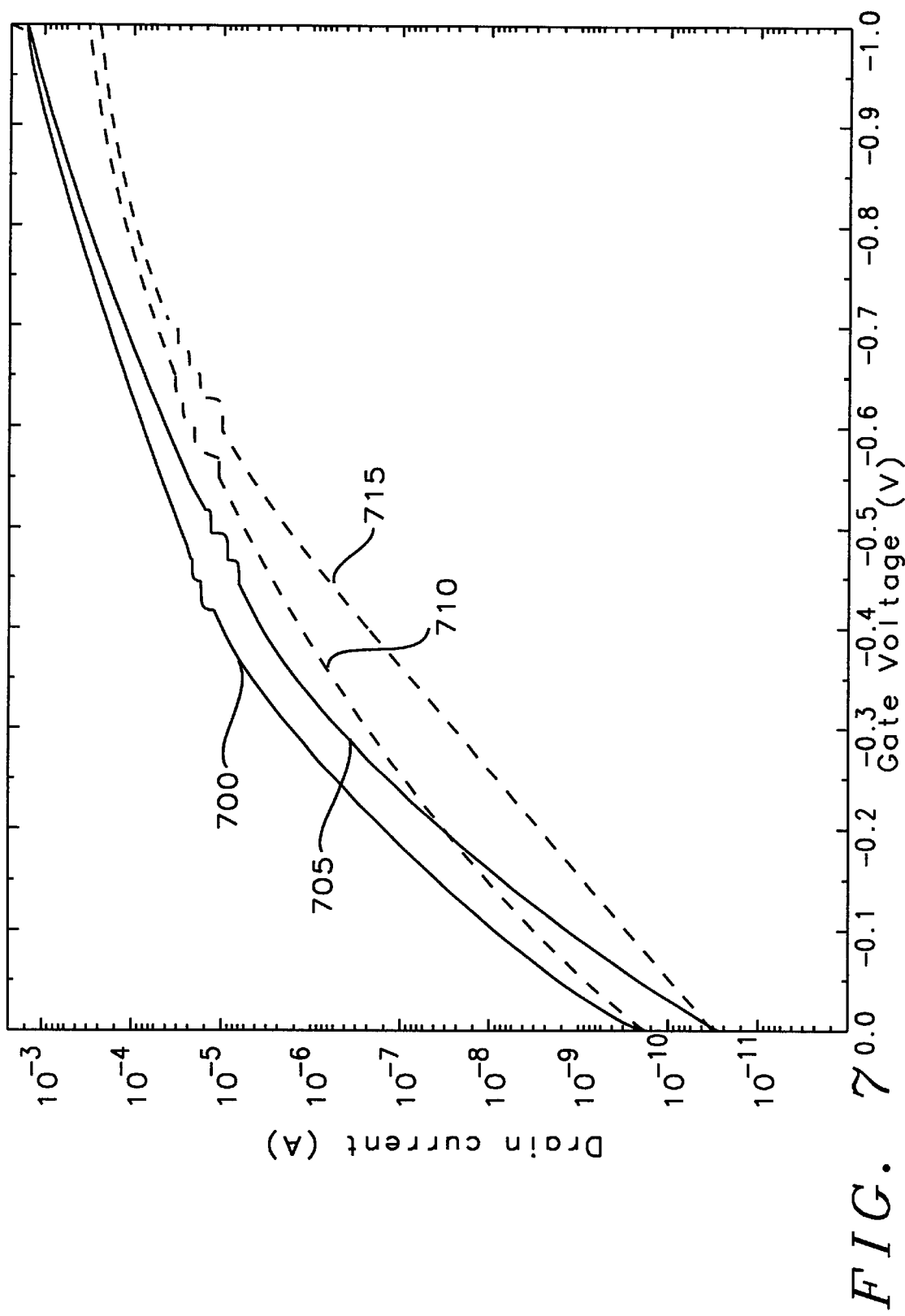
FIG. 7 is a graph of the drain current and the drain/collector current versus the gate voltage respectively for a buried channel MOSFET of the prior art and the buried channel lateral quasi-unipolar transistor of this invention.
Figure 8:
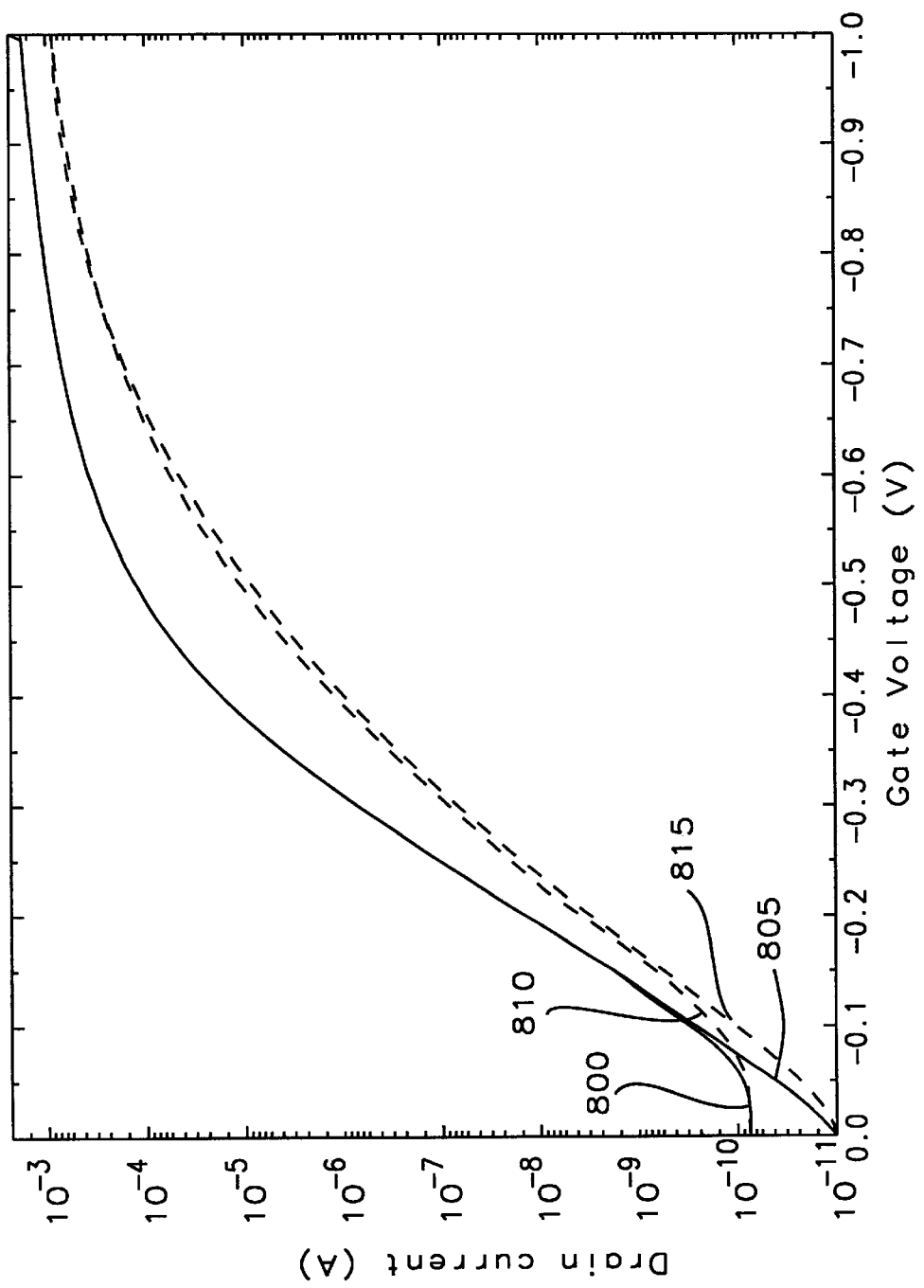
FIG. 8 is a graph of drain current and the drain/collector current versus the gate voltage respectively of a surface channel MOSFET and a lateral quasi-unipolar transistor of the prior art.

To understand the benefits of the buried channel lateral quasi-unipolar transistor refer now to FIGS. 7–16. FIGS. 7 and 8 illustrate a graph of the drain current versus a voltage applied to the gate of a buried channel MOSFET 710 and 715 and the gate of a surface channel MOSFET 810 and 815. The graphs of FIGS. 7 and 8 further show the drain/collector currents versus the base/bulk-gate voltage (the biasing voltage source $V_{DC}$ 140 of FIGS. 3a and 4a is set to zero volt and is configured as in FIGS. 5a and 5b) for a buried channel lateral quasi-unipolar transistor of this invention 700 and 705 and a surface channel lateral quasi-unipolar transistor of the prior art. The plots 700, 710, 800 and 810 have the voltage applied to the drain or drain/collector equal ±2.0V. The plots 705, 715, 805 and 815 are for voltages applied to the drain or drain/collector of ±1.0V.

Figure 9:
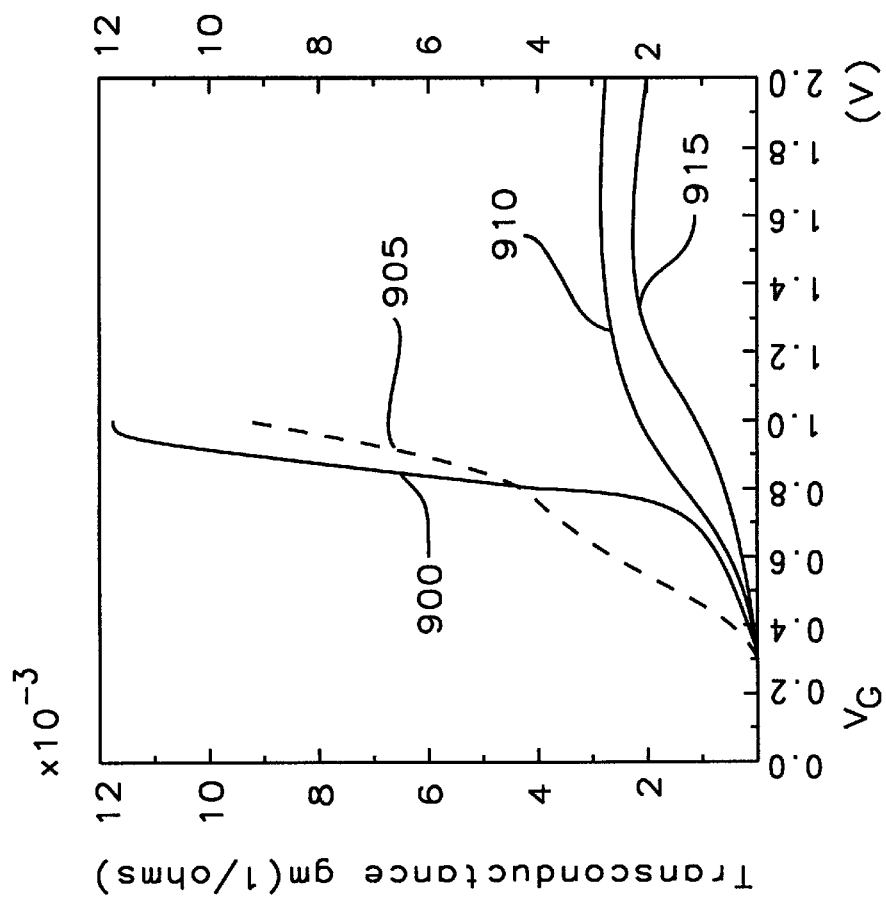
FIG. 9 is a graph of the transconductance versus the gate voltage for a buried channel lateral quasi-unipolar transistor of this invention compared to a surface channel lateral quasi-unipolar transistor of the prior art.

As can be seen, in general, the buried channel lateral quasi-unipolar transistor has a higher drain/collector current than MOSFET's of the prior art. This leads to a higher transconductance gm which is shown in FIG. 9 in the graph of the transconductance gm versus the gate voltage of the buried channel MOSFET and surface channel MOSFET of the prior art and the base/bulkgate voltage if the buried channel lateral quasi-unipolar transistor of this invention and the surface channel lateral quasi-unipolar transistor of the prior art. The transconductance gm increases rapidly for the buried channel lateral quasi-unipolar transistor 900 and the surface channel lateral quasi-unipolar transistor 905 for low bias voltage at the base/bulk-gate. The buried channel MOSFET 910 and the buried channel MOSFET 915 have a transconductance gm that saturates to a low value a high bias. This will operate at a low bias voltage and will reduce power dissipation.

FIGS. 10 and 11 show the graphs of the input-referred noise at 10 Hz versus the transconductance. FIG. 10 shows that the input-referred noise of the buried channel lateral quasi-unipolar transistor of this invention as shown in graph 920 decreases as the transconductance increases. Whereas, the input-referred noise of the buried channel MOSFET 925 and the surface channel MOSFET 935 will actually increase and then fix at a maximum transconductance. The increasing of the input-referred noise in the buried channel and surface channel MOSFET's of the prior art make design of low noise Radio Frequency (RF) or analog applications difficult.

The graph 930 of the input-referred noise of a surface channel lateral quasi-unipolar transistor of the prior art will decrease as the transconductance increases but not to the degree of the decrease of the buried channel lateral quasi-unipolar transistor of this invention.

Figure 12:
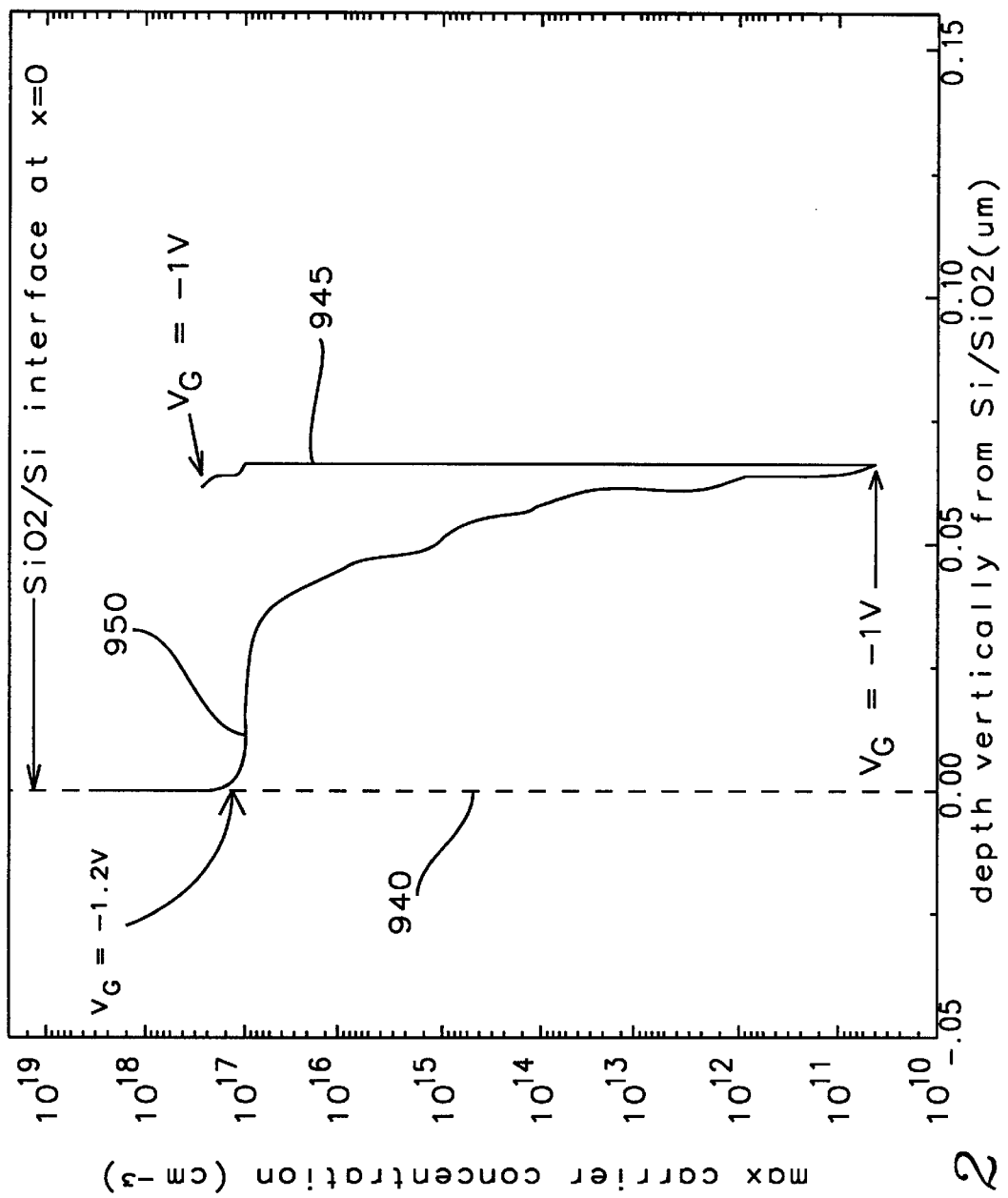
FIG. 12 is a graph of the location of the maximum carrier concentration versus the distance from the interface of the silicon substrate and the gate oxide of a buried channel MOSFET of the prior art and a buried channel lateral quasi-unipolar transistor of this invention.

FIG. 12 illustrates a graph 945 of the location of the maximum carrier concentration as the voltage of the base/bulk-gate is increased of the buried channel lateral quasi-unipolar transistor and a graph 950 of the location of the maximum carrier concentration of the buried channel MOSFET. The graphs show the changes of the carrier concentration as the voltage level applied to the base/bulk-gate of the buried channel lateral quasi-unipolar transistor and the voltage level applied to the gate of the buried channel MOSFET are increased. As the voltage level of the gate approaches approximately −1.2V, the buried channel MOSFET becomes a surface channel device. The defects and traps of the surface will result in a higher flicker or 1/f noise. Whereas, the buried channel lateral quasi-unipolar transistor has its maximum carrier concentration remain internal to the bulk, thus minimizing the flicker or 1/f noise.

Figure 13:
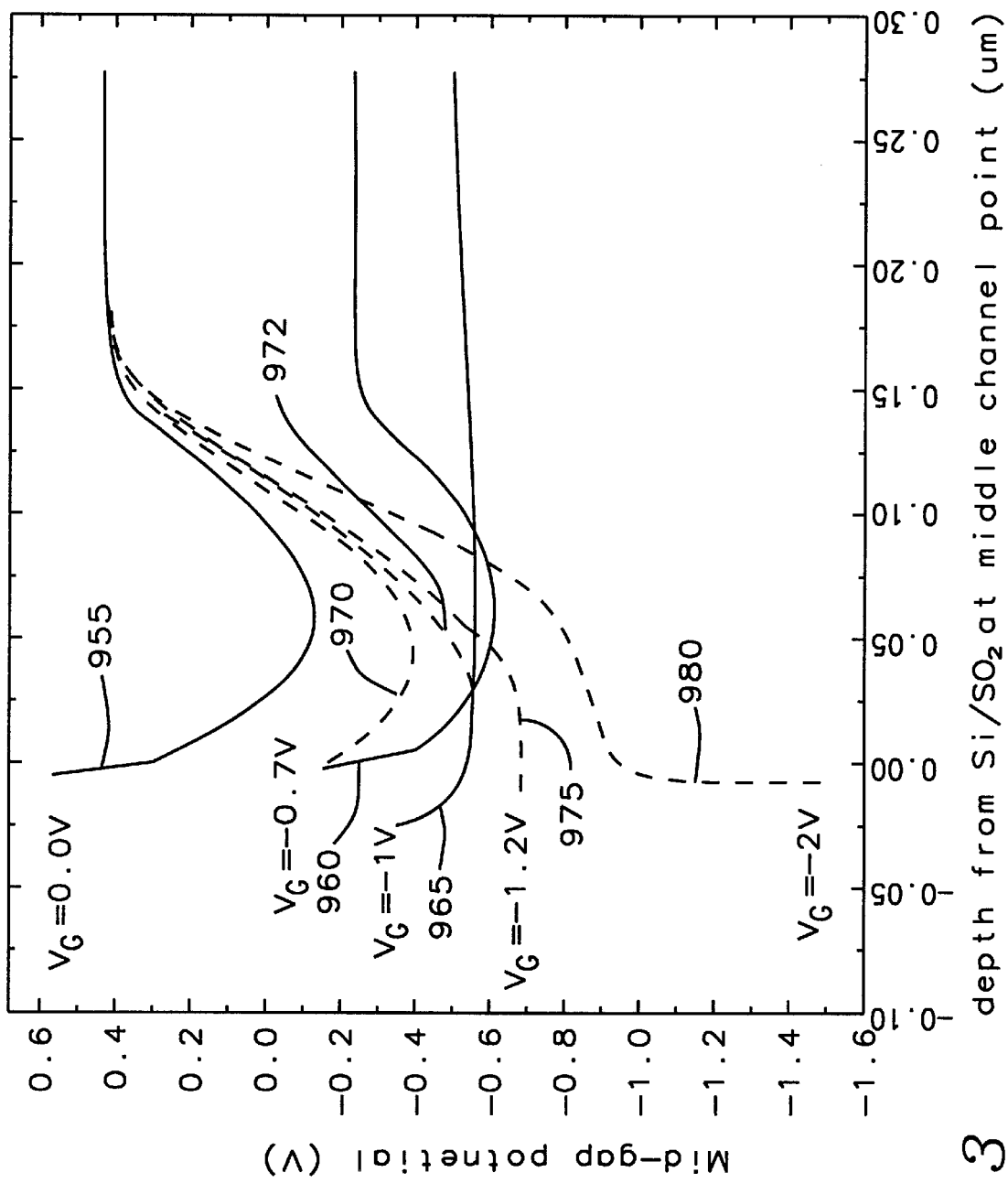
FIG. 13 is a graph of the midgap potential versus the distance from the interface of the silicon substrate and the gate oxide of a buried channel MOSFET of the prior art and a buried channel lateral quasi-unipolar transistor of this invention.

Refer now to FIG. 13 for a discussion of the distribution of the voltage potential levels of the middle of the band-gap as a function of the depth from surface of the semiconductor substrate at the interface of the gate oxide for the buried channel lateral quasi-unipolar transistor of this invention and the buried channel MOSFET of the prior art. The voltage placed between the drain/collector or the drain and the source/emitter is −2.0V. The base/bulk-gate of the buried channel lateral quasi-unipolar transistor has a voltage of 0.0V for graph 955, −0.7V for graph 960, and −1.2V for graph 965. The gate of the buried channel MOSFET has a voltage 0.7V for graph 970, −1.0V for graph 972, and −1.2V for graph 975, and −2.0V for graph 980. It is clearly apparent that the minimum for the potential, having a voltage $V_g$ of −1.2 or greater applied to the gate of the buried channel MOSFET, approaches the surface interface between the gate oxide and the buried channel. The buried channel MOSFET of the prior art now operates as a surface channel MOSFET.

Figure 14:
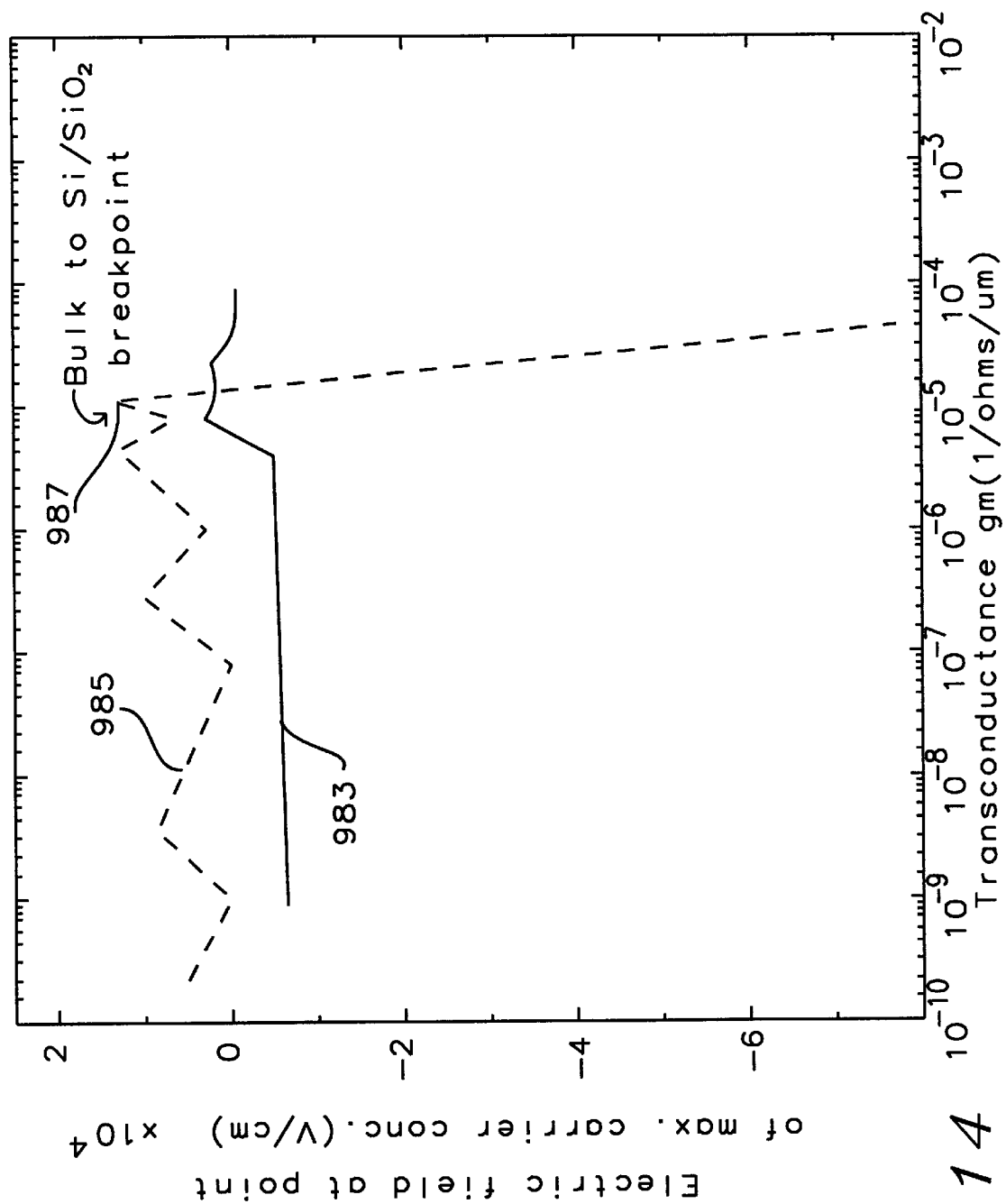
FIG. 14 is a graph of the electric field at the location of maximum carrier concentration versus transconductance of a buried channel MOSFET of the prior art and the buried channel lateral quasi-unipolar transistor of this invention.

FIG. 14 illustrates the effect of the buried channel MOSFET becoming a surface channel device as compared with the buried channel lateral quasi-unipolar transistor of this invention. FIG. 14 is a plot of the electric field strength at the point of maximum carrier concentration versus the transconductance gm for increasing base/bulk-gate voltage for the buried channel lateral quasi-unipolar transistor or increasing gate voltage of the buried channel MOSFET. The graph 985 of the buried channel MOSFET shows the electric field remaining relatively constant until the buried channel MOSFET becomes a surface channel device at the bulk to gate oxide interface breakpoint 987. The electric field increases precipitously. Whereas, the buried channel lateral quasi-unipolar transistor of this invention has the electric field remaining relatively constant. The increasing of the electric field at the bulk to gate oxide interface breakpoint keep carriers flowing at the interface. The traps and effects, as described above, increase the flicker or 1/f noise as compared to that of the buried channel lateral quasi-unipolar transistor.

Figure 15:
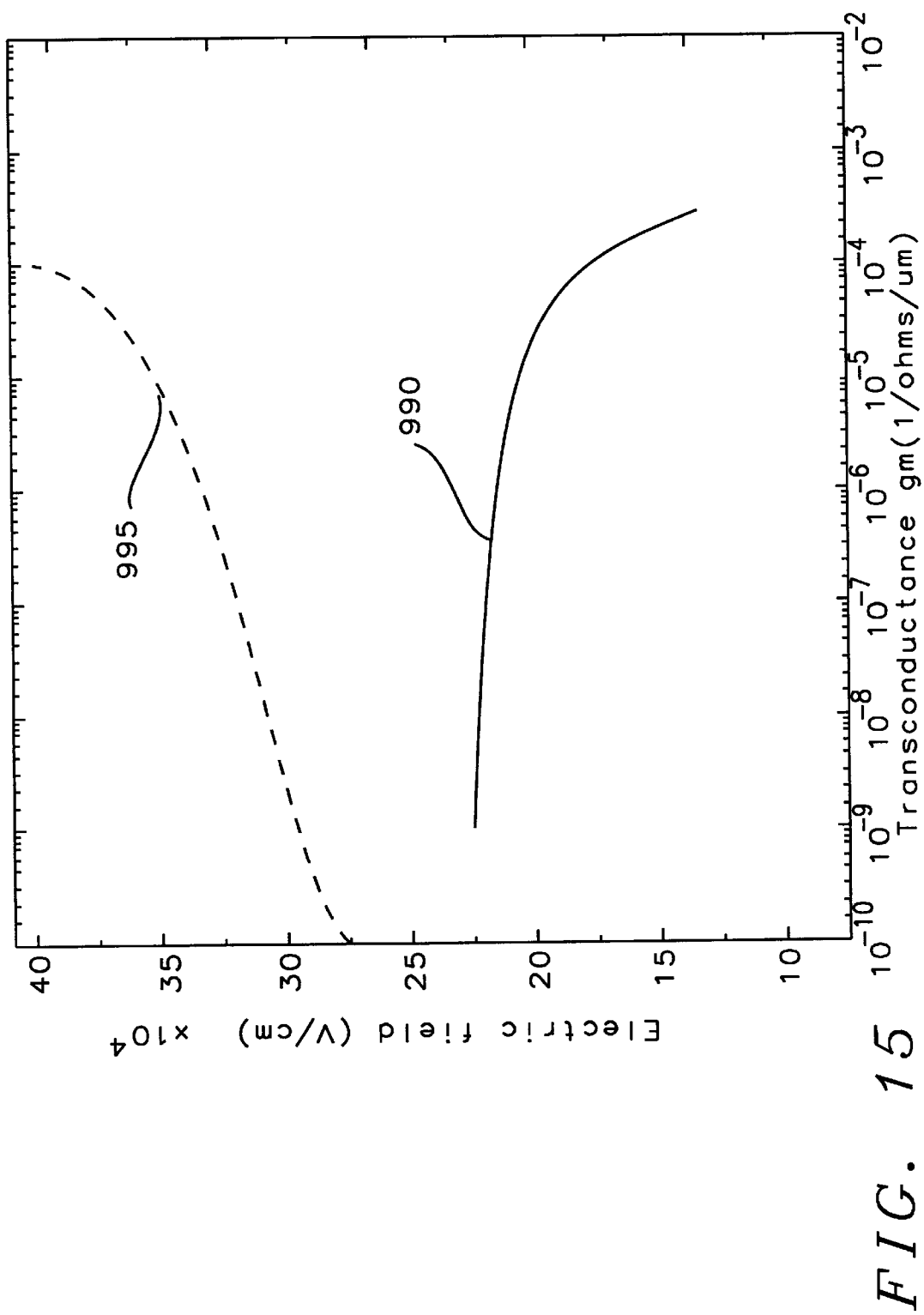
FIG. 15 is a graph of the electric field at the surface channel versus transconductance of a surface channel MOSFET of the prior art and the buried channel lateral quasi-unipolar transistor of this invention.

Further, FIG. 15 shows the electric field at the middle point of the surface channel versus the transconductance for a surface channel MOSFET and the surface channel lateral quasi-unipolar transistor of the prior art. Again, the electric field increases in the surface channel MOSFET as the transconductance gm increases as shown in graph 995. This increase in the electric field will exhibit higher flicker or 1/f noise as above described. The graph 990 shows the electric field decreasing as the transconductance increases. However, the electric field of the surface channel lateral quasi-unipolar transistor is greater than that of the buried channel lateral quasi-unipolar transistor of this invention. Since the surface channel lateral quasi-unipolar transistor is at or near the surface interface of the bulk region and the gate oxide, the flicker or 1/f noise is larger than that of the buried channel lateral quasi-unipolar transistor of this invention as shown in FIGS. 10 and 11. As is shown, the lower flicker or 1/f noise of buried channel lateral quasi-unipolar transistor allow a higher frequency of operation when compared to the buried channel or surface channel MOSFET or the surface channel lateral quasi-unipolar transistor of the prior art.

While this invention has been particularly shown and described with reference to the preferred embodiments thereof, it will be understood by those skilled in the art that various changes in form and details may be made without departing from the spirit and scope of the invention.

The invention claimed is:

1. A method for forming a buried channel lateral quasi-unipolar transistor having low 1/f noise comprising the steps of:

implanting a material of a first conductivity type to a low concentration into a surface of a semiconductor substrate to form a bulk region that is a base of a quasi-unipolar transistor;

implanting a material of a second conductivity type to a high concentration into the surface of the semiconductor substrate to form a drain region that is a drain/collector and a source region that is a source/emitter of the quasi-unipolar transistor, whereby the drain region is separated distally from the source region;

implanting the material of the second conductivity type to a low concentration into the surface of the semiconductor substrate to form a channel region between the drain region and the source region, whereby said channel region is a low resistivity path between the drain/collector and the source/emitter;

implanting the material of the first conductivity type to a low concentration between the channel region and the surface of the semiconductor substrate to form an overlayer;

forming a gate oxide on the surface of the semiconductor substrate above the channel region between the drain region and the source region;

placing a conductive material on the gate oxide above the channel region to form the gate electrode of the quasi-unipolar transistor; and connecting a biasing voltage source between the gate electrode and the bulk region to lower a built-in voltage of said quasi-unipolar transistor.

2. The method of claim 1 wherein implanting the material of the first conductivity type to form the bulk region is done to a depth of 0.8 μm.

3. The method of claim 1 wherein the conductive material forming the gate electrode is a heavily doped polycrystalline silicon doped with an impurity of the material of the first conductivity type.

4. The method of claim 1 wherein implanting the material of the first conductivity type to form the bulk region is to a concentration of approximately $1 \times 10^{17}$ holes/cm$^3$.

5. The method of claim 1 wherein implanting the material of the second conductivity type to form the drain region and the source region is to a depth of 0.25 μm.

6. The method of claim 1 wherein implanting the material of the second conductivity type to form the drain region and the source region is to a concentration of from approximately $1 \times 10^{20}$ electrons/cm$^3$ to approximately $2 \times 10^{20}$ electrons/cm$^3$.

7. The method of claim 1 wherein implanting the material of the second conductivity type to form the channel region is to a depth of approximately 50 nm from the surface of the semiconductor substrate.

8. The method of claim 1 wherein the conductive material forming the gate electrode is a heavily doped polycrystalline silicon doped with an impurity of the material of the first second type.

9. The method of claim 1 wherein implanting the material of the first conductivity type to form the accumulation region is to a depth of 25 nm from the surface of the semiconductor substrate and the implanting of the material of the second conductivity type to form the channel region is 50 nm from the surface of the semiconductor substrate.

10. The method of claim 1 wherein implanting the material of the first conductivity type to form the accumulation region is to a concentration of approximately $1 \times 10^{17}$ holes/cm$^3$.

11. The method of claim 1 wherein a base width of said quasi-unipolar transistor that is the distance between the drain region and the source region is less than 1.0 μm, preferably less than 0.3 μm.

12. The method of claim 1 wherein the biasing voltage source has a voltage level of 0V effectively connecting the base of the quasi-unipolar transistor to the gate electrode.

13. The method of claim of 1 wherein a width dimension of the channel region, the source region, and the drain region is from approximately 5 μm to 10 μm.

14. The method of claim 1 further comprising implanting the material of the second conductivity type to a low concentration into the surface of the semiconductor substrate to form a diffusion well into which the bulk region is implanted.

* * * * *